United States Patent

Aoshima

Patent Number: 5,698,361
Date of Patent: Dec. 16, 1997

[54] PHOTOSENSITIVE COMPOSITION

[75] Inventor: Keitaro Aoshima, Shizuoka-ken, Japan

[73] Assignee: Fuji Photo Film Co., Ltd., Minami-Ashigara, Japan

[21] Appl. No.: 142,044

[22] Filed: Oct. 28, 1993

Related U.S. Application Data

[63] Continuation-in-part of Ser. No. 953,259, Sep. 30, 1992, abandoned.

[30] Foreign Application Priority Data

Oct. 7, 1991 [JP] Japan .................. 3-259432
Nov. 19, 1991 [JP] Japan .................. 3-303229

[51] Int. Cl.$^6$ .................................. G03F 7/021
[52] U.S. Cl. .................. 430/176; 430/157; 430/175; 430/906; 522/32
[58] Field of Search .................. 430/175, 176, 430/157, 906; 522/32

[56] References Cited

U.S. PATENT DOCUMENTS

| | | | |
|---|---|---|---|
| 4,123,276 | 10/1978 | Kita et al. | 430/176 |
| 4,275,138 | 6/1981 | Kita et al. | 430/175 |
| 4,304,832 | 12/1981 | Ohta et al. | 430/175 |
| 4,681,833 | 7/1987 | Nagasawa et al. | 430/175 |
| 4,711,830 | 12/1987 | Haruta et al. | 430/175 |
| 5,039,734 | 8/1991 | Kinoshita et al. | 528/85 |
| 5,047,309 | 9/1991 | Koike et al. | 430/159 |
| 5,260,161 | 11/1993 | Matsumura et al. | 430/175 |
| 5,300,397 | 4/1994 | Aoshima | 430/176 |
| 5,320,928 | 6/1994 | Aoai | 430/175 |
| 5,368,976 | 11/1994 | Tajima et al. | 430/176 |

*Primary Examiner*—John S. Chu
*Attorney, Agent, or Firm*—Burns, Doane, Swecker & Mathis, LLP

[57] ABSTRACT

The present invention relates to a negative-working photosensitive composition comprising a diazonium compound and a polymer binder, said polymer binder being:

(1) an AB type, ABA type or BAB type block copolymer of:
  (i) a block (A) having a unit having the following formula (I):

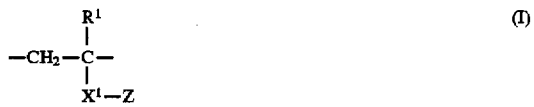

and
  (ii) a block (B) having a unit (II) which having the following formula and being free from unit (I):

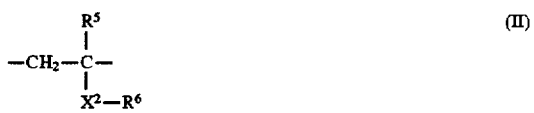

or (2) a block copolymer obtained by subjecting to radical polymerization.
  (i) an azo group-containing polyurethane (C) which contains a unit (C1) having the following formula (III) and a unit (C2) having the following formula (IV) in the molecule and which has a weight-average molecular weight of 2,000–200,000; and
  (ii) a polymerizable monomer having the following formula (I').

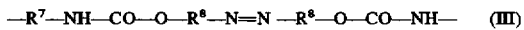

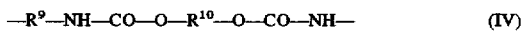

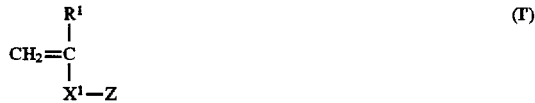

There can be obtained a negative-working photosensitive composition which has an improved abrasion resistance and which is useful for the production of lithographic printing plates with an improved printing durability.

17 Claims, No Drawings

5,698,361

PHOTOSENSITIVE COMPOSITION

REFERENCE TO RELATED APPLICATIONS

This is a continuation-in-part of U.S. Ser. No. 07/953,259, filed Sep. 30, 1992, now abandoned, which is incorporated herein by reference, in its entirety.

BACKGROUND OF THE INVENTION

The present invention relates to a photosensitive composition, which can be employed in the production of integrated circuits and photo-masks. In particular, the present invention relates to a negative-working photosensitive composition having an improved printing durability due to an improved abrasive resistance or an improved chemical-resistance.

Most of the photosensitive materials used in negative-working photosensitive compositions are diazonium compounds. Most generally used diazonium resins are formaldehyde condensates of p-diazodiphenyl amines.

The compositions used in the photosensitive layers for photosensitive lithographic printing plates using diazo resins can be classified into two types, one is those compositions containing only such diazo resins (i.e., the compositions containing no binders) as disclosed in U.S. Pat. No. 2,714,066, and the other is those compositions containing both the diazo resins and binders, as disclosed in Japanese Patent Unexamined Publication (hereinafter referred to as "J. P. Kokai") No. Sho 50-30604. Recently, most of the photosensitive compositions containing the diazo resins and used in the photosensitive lithographic printing plates have been those compositions containing the diazo resins and polymers as a binder in order to provide the resultant lithographic printing plates with a high printing durability.

As disclosed in J. P. Kokai No. Sho 50-30604, an alkaline developable photosensitive layer (wherein unexposed portions are removed, i.e., (developed) with an aqueous alkaline developer) and a solvent developable photosensitive layer (wherein unexposed portions are removed with an organic solvent developer) are employed as a photosensitive layer obtained from such photosensitive compositions containing both diazo resins and polymer binders. Due to safety and hygiene considerations, much attention has been paid to the alkaline developable photosensitive layers. Whether the layer is alkaline developable or solvent developable is mainly dependent on the property of the binders. As a method for providing the binders with an alkaline developability, there have been proposed, for example, a method of introducing a carboxylic acid into a polymer by copolymerizing carboxylic acid containing monomers as disclosed in J. P. Kokai No. Sho 50-30604, or by reacting the hydroxy group of polyvinyl alcohol with cyclic acid anhydride such as phthalic anhydride as disclosed in U.S. Pat. No. 2,861,058.

However, those polymers have poor abrasion resistance. Therefore, lithographic printing plates having a photosensitive layer containing those polymers as a binder have a low printing durability.

On the other hand, photosensitive compositions containing a carboxyl group-containing polyurethane resin as disclosed in J. P. Kokai No. Sho 62-123452 provide an improved abrasion resistance. When they are used as a photosensitive layer in photosensitive lithographic printing plates, the resultant lithographic printing plates have a relatively high printing durability. However, such lithographic printing plates have problems in that they have a poor chemical resistance and that they have a poor printing durability, especially when printing with UV ink.

SUMMARY OF THE INVENTION

One object of the present invention is to provide a negative-working photosensitive composition containing a polymer having an improved abrasion resistance, thereby providing a lithographic printing plate produced from a photosensitive lithographic printing plate having such a photosensitive composition with an improved printing durability.

The inventors of this invention have conducted intensive studies to achieve the foregoing object and, as a result, have found out that by incorporating a block copolymer having specific units into a negative-working photosensitive composition as a binder, the resultant lithographic printing plate has an improved abrasion resistance and/or chemical-resistance. On the basis of the above findings, the present invention has been completed.

According to the present invention, there is provided a negative-working photosensitive composition comprising a diazonium compound and a polymer binder, said polymer binder being:

(1) an AB type, ABA type or BAB type block copolymer of:
  (i) a block (A) having a unit having the following formula (I):

wherein $R^1$ is a hydrogen atom or a methyl group; $X^1$ is a single bond or a bivalent connecting group comprising two or more atoms selected from C, H, N, O and S; Z is —COOH,

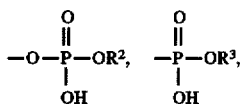

—$SO_3H$, or —$CONHSO_2R^4$; $R^2$ and $R^3$ are independently a hydrogen atom or a hydrocarbon group of $C_1$–$C_{15}$ which may have a substituent; and $R^4$ is a hydrocarbon group of $C_1$–$C_{15}$ which may have a substituent; and (ii) a block (B) having a unit (II) which having the following formula and being free from unit (I):

wherein $R^5$ is a hydrogen atom or a methyl group; $X^2$ is a single bond, an ester bond, or an amide bond, $R^6$ is a hydrocarbon group having $C_1$–$C_{15}$ which may have a substituent, or (2) a block copolymer obtained by subjecting to radical polymerization:
  (i) an azo group-containing polyurethane (C) which contains a unit (C1) having the following formula (III) and a unit (C2) having the following formula (IV) in the molecule and which has a weight-average molecular weight of 2,000–200,000; and (ii) a polymerizable monomer having the following formula (I').

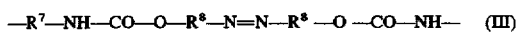

wherein $R^7$ is a bivalent hydrocarbon group of $C_2$–$C_{20}$ which may have a substituent; and $R^8$ is a bivalent hydrocarbon group of $C_2$–$C_{20}$ which may have a substituent and may have an amide bond;

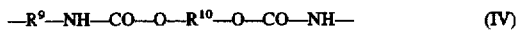

wherein $R^9$ is a bivalent hydrocarbon group of $C_2$–$C_{20}$ which may have a substituent; and $R^{10}$ is a bivalent hydrocarbon group of $C_2$–$C_{20}$ which may have a substituent and may have an amide bond, a urea bond, a urethane bond, an ester bond or an ether bond; and

wherein $R^1$, $X^1$ and Z are defined above.

The present invention will be explained in detail below.

The present block copolymer comprising the block (A) and the block (B) can be synthesized according to the conventional polymerization process by using a polymerizable monomer (I') having the following formula (I') which forms the unit (I) of the block (A) and a polymerizable monomer (II') having the following formula (II') which forms the unit (II) of the block (B).

wherein $R^1$, $X^1$ and Z are defined above.

wherein $R^5$, $X^2$ and $R^6$ are defined above.

The polymerizable monomer (I') includes polymerizable monomers having the following formulae:

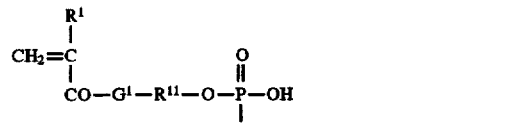

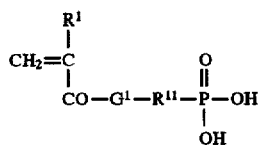

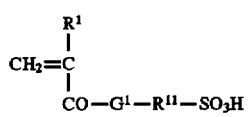

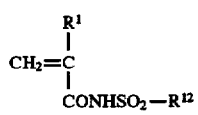

wherein $R^1$ is defined as above; $R^{11}$ is a connecting group of $C_1$–$C_{15}$ which may have a substituent; $R^{12}$ is a hydrocarbon group of $C_1$–$C_{15}$ which may have a substituent; and $G^1$ is —O— or —NH—.

Specific examples of the polymerizable monomer (I') include the monomers having the following formulae:

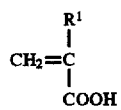

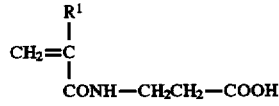

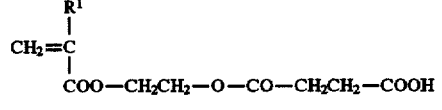

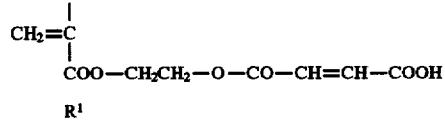

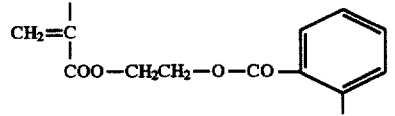

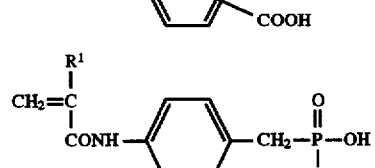

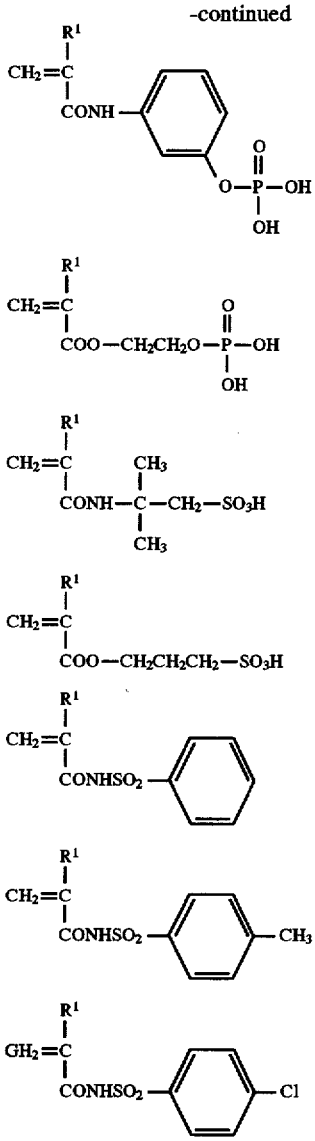

wherein R¹ is defined above.

The polymerizable monomer (II) includes esters of acrylic acid, acrylamides, esters of methacrylic acid, methacrylamides, vinyl esters and styrenes.

Specific examples of esters of acrylic acid include alkyl acrylates (e.g., methyl acrylate, ethyl acrylate, propyl acrylate, butyl acrylate, amyl acrylate, 2-ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate and tetrahydrofurfuryfacrylate) and aryl acrylates (e.g., phenyl acrylate).

Specific examples of esters of methacrylic acid include alkyl methacrylates (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate); and aryl methacrylates (e.g., phenyl methacrylate, cresyl methacrylate, and naphthyl methacrylate).

Specific examples of acrylamides include acrylamide, N-alkyl acrylamides (the alkyl group thereof includes methyl, ethyl, propyl, butyl, t-butyl, heptyl, octyl, cyclohexyl, benzyl and hydroxyethyl); N-aryl acrylamides (the aryl group thereof includes phenyl, tolyl, nitrophenyl, naphthyl, hydroxyphenyl and sulfamoylphenyl); N,N-dialkyl acrylamides (the alkyl group thereof includes methyl, ethyl, butyl, isobutyl, ethylhexyl and cyclohexyl); N,N-diaryl acrylamides (the aryl group thereof includes phenyl); N-methyl-N-phenyl acrylamide; N-hydroxyethyl-N-methyl acrylamide; and N-2-acetamidoethyl-N-acetyl acrylamide.

Specific examples of methacrylamides include methacrylamide, N-alkyl methacrylamides (the alkyl group thereof includes methyl, ethyl, t-butyl, ethylhexyl, hydroxyethyl and cyclohexyl); N-aryl methacrylamides (the aryl group thereof includes phenyl, hydroxyphenyl and sulfamoylphenyl); N,N-dialkyl methacrylamides (the alkyl group thereof includes methyl, ethyl, butyl, isobutyl, ethylhexyl and cyclohexyl); N,N-diaryl methacrylamides (the aryl group thereof includes phenyl); N-hydroxyethyl-N-methyl methacrylamide; N-methyl-N-phenyl methacrylamide; and N-ethyl-N-phenyl methacrylamide.

Specific examples of vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenyl butyrate, vinyl cyclohexyl carboxylate, vinyl acetate, vinyl benzoate, vinyl salicylate, vinyl chlorobenzoate, vinyl tetrachlorobenzoate, and vinyl naphthoate.

Specific examples of styrenes include styrene, alkyl styrenes (e.g., methylstyrene, dimethylstyrene, trimethylstyrene, ethyl styrene, diethyl styrene, isoporpyl styrene, butyl styrene, hexyl styrene, cyclohexyl styrene, decyl styrene, benzyl styrene, chloromethylstyrene, trifluorostyrene, ethoxy methyl styrene and acetoxymethyl styrene); alkoxy styrenes (e.g., methoxy styrene, 4-methoxy-3-methylstyrene and dimethoxy styrene); and halogenated styrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluorostyrene and 4-fluoro-3-trifluoromethylstyrene).

Among these monomers, esters of acrylic acid and methacrylic acid and styrenes are preferred.

The block copolymer of the present invention comprising the block (A) and the block (B) is classified into three types, i.e., AB block copolymers, ABA block copolymers and BAB block copolymers.

The present block copolymer comprising the block (A) and the block (B) is preferably synthesized according to the conventional polymerization methods using the polymerizable monomers (I') and (II) as explained above. Since the monomer (I') contains an acidic group (Z), it is preferable that the present block copolymer should be synthesized by the following methods.

One of these methods is illustrated by the following scheme (1).

As illustrated in the scheme (1), the acidic group of the monomer is protected, the block polymerization thereof is conducted according to known so-called living polymerization such as ionic polymerization using organo metallic compounds (e.g., alkyl lithiums, lithium dipropylamides and alkyl magnesium halides) or hydroiodic acid/iodine system; photopolymerization reaction using porphyrin metal complex as a catalyst; or a group transfer polymerization, and then the protective group is removed from the acidic group by hydrolysis, hydrogenation decomposition reaction, oxidation decomposition reaction or photo-decomposition reaction.

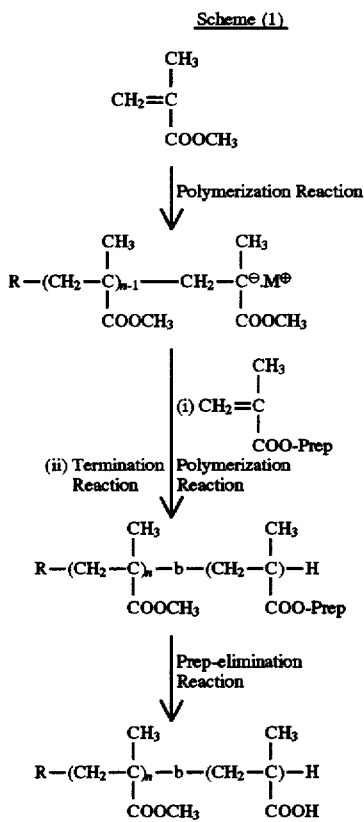

R means, for example, an alkyl group or a porphyrin ring residual group.

Prep means a protective group such as —C(C$_6$H$_5$)$_3$ or —Si(C$_3$H$_7$)$_3$.

b means a block bond.

This synthesis can be easily conducted according to the methods as disclosed in P. Lutz, P. Masson et al, Polym. Bull. 12:79 (1984); B. C. Anderson, G. D. Andrew et al., Macromolecules 14:1601 (1981); K. Hatada, K. Ute et al., Polym. J. 17:977 (1985) and 18:1037 (1986); K. Migite, K. Koichi, Kobunshi Kako 36:366 (1987); T. Higashimura, M. Sawamoto, Kobunshi Ronbunshu 46:189 (1989); M. Muroki, T. Aida, J. Am. Chem. Soc., 109:4737 (1987); T. Aida, S. Inoue, Organic Synthetic Chem., 43:300 (1985); D. Y. Sogah, W. R. Hertler et al., Macromolecules 20:1473 (1987); M. Morton, T. E. Helminiak et al., J. Polym. Sci., 57:471(19862); B. Gordon III, M. Blumenthal, J. E. Loftus, Polym. Bull., 11:349 (1984); and R. B. Bates, W. A. Beavers et al., J. Org. Chem., 44:3800 (1979).

The protection of a specific polar group with a protective group and the elimination of the protective group can be readily performed by recognized techniques.

More specifically, these reactions can be easily conducted by suitably selecting the methods as illustrated in Y. Iwakura, K. Kurita, "Reactive Polymer" published by Kodan-sha (1977); and T. W. Greene, "Protective Groups in Organic Synthesis" published by John Wiley & Sons (1981); J. F. W. McOmie, "Protective Groups in Organic Chemistry" published by Plenum Press (1973).

The present block copolymer having the blocks (A) and (B) can be also easily synthesized by using monomers having an unprotected acidic group and by conducting a polymerization reaction thereof under light using a dithiocarbamate group-containing compound and/or xanthate group- containing compound as an initiator. More specifically, this synthesis can be conducted according to the methods as disclosed in T. Ohtsu, Polymer 37:248 (1988); T. Hinomori, T. Ohtsu, Polym. Rep. Jap., 37:3508 (1988); J. P. Kokai Nos. Sho 64-111 and 64-26619; N. Azuma et al., Polymer Preprints, Japan, 36(6):1511 (1987); and M. Niwa, N. Higashi etal., J. Macromol. Sci. Chem., A24(5):567 (1987).

Further, the present block copolymer containing the blocks (A) and (B) can be synthesized according to the method comprising synthesizing azobis compounds containing either of the block (A) or (B) (i.e., polymeric azobis initiators), and radically polymerizing the monomers which form the other block, using the resultant azobis compound as an initiator. More specifically, this synthesis can be conducted according to the methods as disclosed in A. Ueda, S. Nagai, Kobunshi Ronbunshu 44:469 (1987) and A. Ueda, Report in Ohsaka-shiritsu Industrial Laboratory84 (1989). In this case, it is preferable that polymeric azobis initiators containing the block (B) should be used because such azobis initiators can be easily synthesized. The following scheme (2) will show this synthesis.

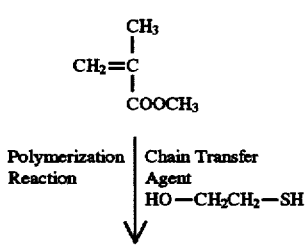

-continued
Scheme (2)

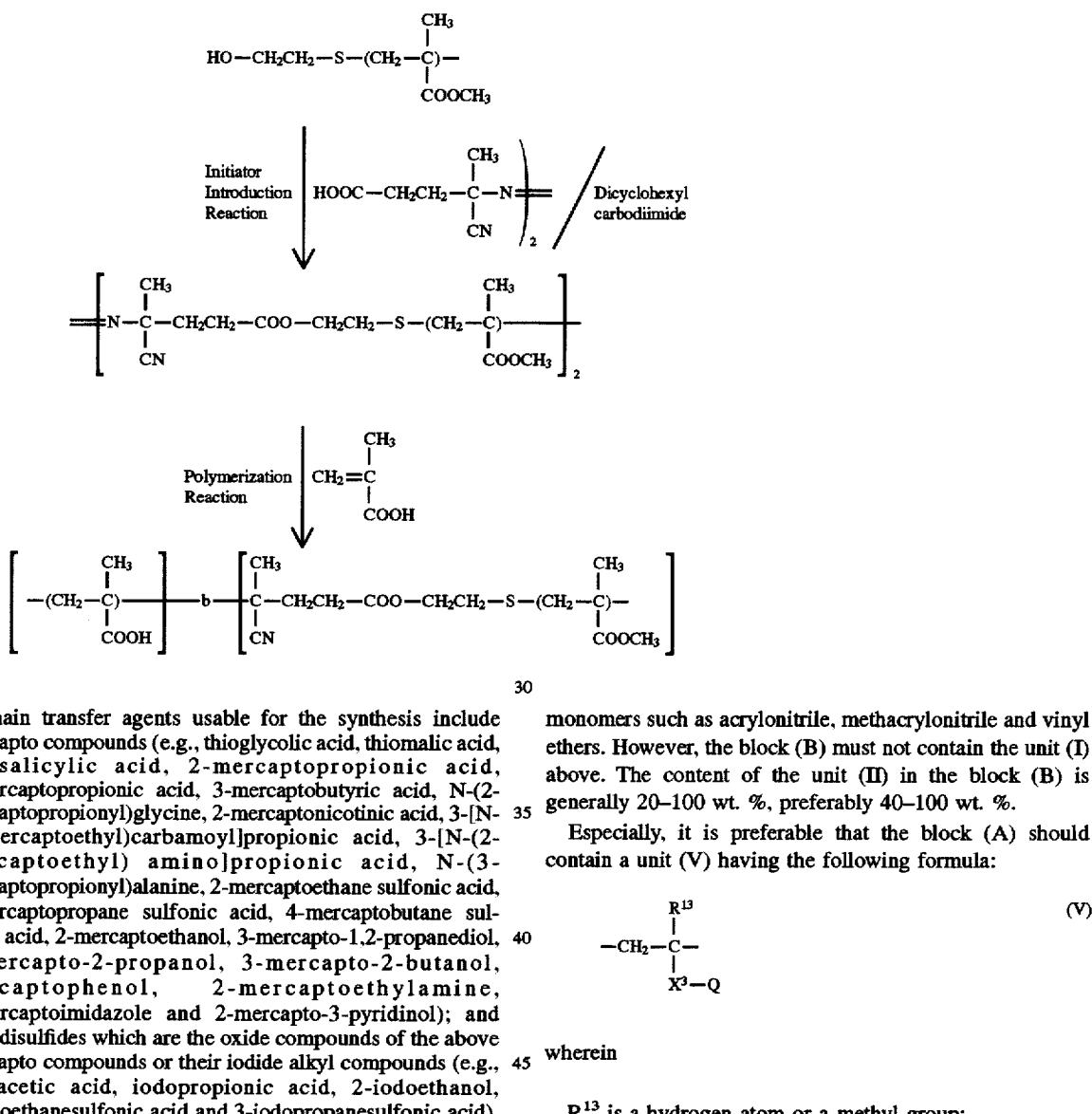

Chain transfer agents usable for the synthesis include mercapto compounds (e.g., thioglycolic acid, thiomalic acid, thiosalicylic acid, 2-mercaptopropionic acid, 3-mercaptopropionic acid, 3-mercaptobutyric acid, N-(2-mercaptopropionyl)glycine, 2-mercaptonicotinic acid, 3-[N-(2-mercaptoethyl)carbamoyl]propionic acid, 3-[N-(2-mercaptoethyl) amino]propionic acid, N-(3-mercaptopropionyl)alanine, 2-mercaptoethane sulfonic acid, 3-mercaptopropane sulfonic acid, 4-mercaptobutane sulfonic acid, 2-mercaptoethanol, 3-mercapto-1,2-propanediol, 1-mercapto-2-propanol, 3-mercapto-2-butanol, mercaptophenol, 2-mercaptoethylamine, 2-mercaptoimidazole and 2-mercapto-3-pyridinol); and their disulfides which are the oxide compounds of the above mercapto compounds or their iodide alkyl compounds (e.g., iodoacetic acid, iodopropionic acid, 2-iodoethanol, 2-iodoethanesulfonic acid and 3-iodopropanesulfonic acid).

Polymerization initiators usable in the polymerization reactions and the initiator introduction reactions include 2,2'-azobis(2-cyanopropanol, 2,2'-azobis(2-cyanopentanol), 4,4'-azobis(4-valeric acid), 4,4'-azobis(4-cyanovaleric chloride), 2,2'-azobis[2-(5-methyl-2-imidazolin-2-yl) propane], 2,2'-azobis[2-(2-imidazolin-2-yl)propane], 2,2'-azobis[2-(3,4,5,6-tetrahydropyridin-2-yl)propane], 2,2'-azobis 12 {2[1-(2-hydroxyethyl)-2-imidazolin-2-yl] propane}, and 2,2'-azobis[2methyl-N-(2-hydroxyethyl)-propionamide], and their derivatives.

The block (A) may contain two or more of the units defined by the formula (I). The block (A) may also include a unit (II). Further, the block (A) may also contain a unit derived from the other polymerizable monomers such as acrylonitrile, methacrylonitrile and vinyl ethers. The content of the unit (I) in the block (A) is generally 10–100 wt. %, preferably 20–100 wt. %.

The block (B) may contain, two or more of the units defined by the formula (II). In addition, the block (B) may also contain a unit derived from the other polymerizable monomers such as acrylonitrile, methacrylonitrile and vinyl ethers. However, the block (B) must not contain the unit (I) above. The content of the unit (II) in the block (B) is generally 20–100 wt. %, preferably 40–100 wt. %.

Especially, it is preferable that the block (A) should contain a unit (V) having the following formula:

wherein $R^{13}$ is a hydrogen atom or a methyl group;

$X^3$ is a single bond or a bivalent connecting group comprising two or more atoms selected from C, H, N, O and S; and Q is —OH or —CN.

Specific examples of this unit are illustrated below.

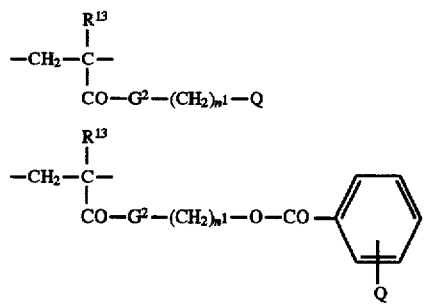

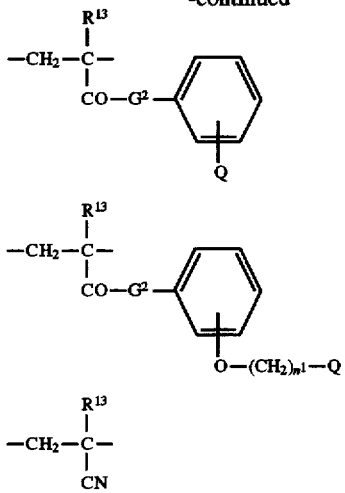

wherein
R$^{13}$ and Q are defined above;
G$^2$ is —O— or —NH—; and
n$^1$ is an integer of 20 or less.

This unit can be introduced into the block (A) by using a polymerizable monomer corresponding to the unit. Alternatively, this unit can also be introduced into the block (A) by conducting a suitable polymer reaction after the production of the present block copolymer, as illustrated in the following scheme (3):

Scheme (3)

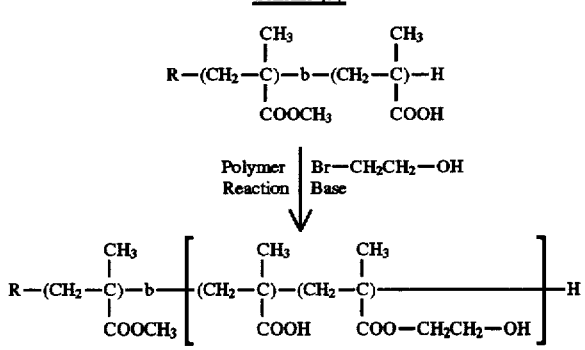

The content of the unit (V) in the block (A) is generally 0–90 wt. %, preferably 0–80 wt. %.

The block (A) is contained in the present block copolymer in an amount of 5–95 wt. %, preferably 10–90 wt. %.

The present block copolymer containing the blocks (A) and (B) preferably has a weight-average molecular weight of 2,000 or higher, much preferably 5,000–300,000. The number-average molecular weight thereof is preferably 800 or higher, much preferably 1,000–250,000. The polydispersity (weight-average molecular weight/number-average molecular weight) thereof is preferably 1 or higher, much preferably 1.1–10.

Solvents usable for the production of the block copolymer includes ethylene dichloride, cyclohexane, methyl ethyl ketone, acetone, methanol, ethanol, ethyleneglycol monomethyl ether, ethyleneglycol monoethyl ether, 2-methoxyethyl acetate, diethyleneglycol dimethyl ether, 1-methoxy-2-propanol, 1-methoxy-2-propylacetate, N,N-dimethyl formamide, N,N-dimethylacetoamide, toluene, ethyl acetate, methyl lactate, ethyl lactate, dimethylsulfoxide and water.

The solvents may be used singly or as a mixture thereof.

AZO group-containing polyurethane (C) to form the block copolymer (2) comprises a unit (C1) having the formula (III) and a unit (C2) having the formula (IV) and may be synthesized according to the conventional methods as disclosed in Angew. Makromol. Chem., 1:92 (1967); and J. P. Kokai Nos. Hei 1-138207 and 1230604.

More specifically, this polyurethane (C) can be synthesized according to the conventional methods using azo group-containing diols having the following formula (VI); diol compounds having the following formula (VII); and diisocyanate compounds having the following formula (VIII).

 (VI)

 (VII)

 (VIII)

wherein R$^8$ and R$^{10}$ are defined above; and R$^{14}$ is a bivalent hydrocarbon group of C$_2$–C$_{20}$, which may have a substituent.

Preferred azo group-containing diols (VI) usable for the production of the polyurethane (C) include the following compounds.

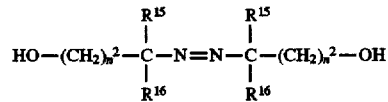

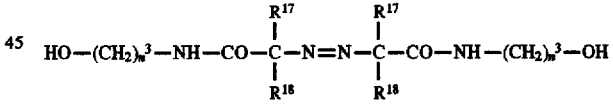

wherein R$^{15}$, R$^{16}$, R$^{17}$ and R$^{18}$ are independently a hydrogen atom, an alkyl group of C$_{10}$ or lower, a cyano group or an aromatic group of C$_{10}$ or lower (preferably, a methyl group, a cyano group, a phenyl group); and n$^2$ and n$^3$ are an integer from 0 to 12.

Specific examples of the azo group-containing diols include the following compounds.

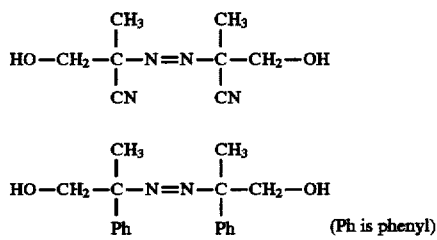

(Ph is phenyl)

-continued

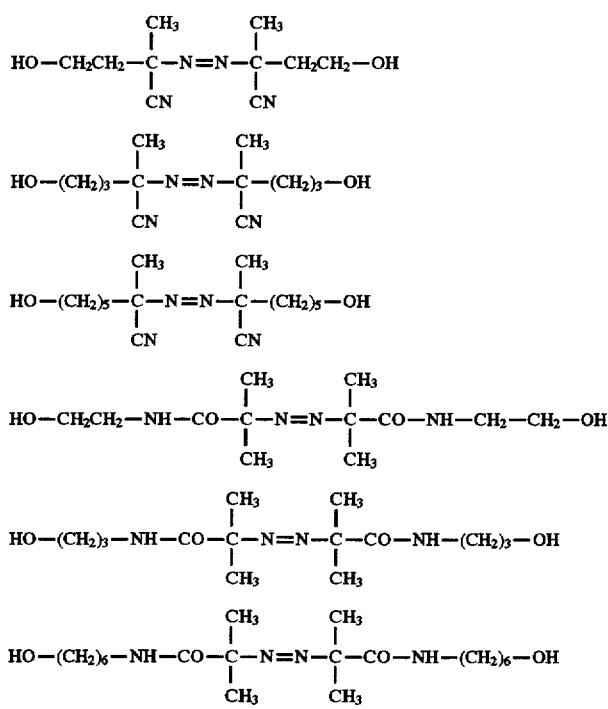

The diol compounds having the formula (VII) suitably usable in the present invention include ethyleneglycol, diethyleneglycol, triethyleneglycol, tetraethyleneglycol, propyleneglycol, dipropyleneglycol, polyethylene glycol, polypropylene glycol, neopentyl glycol, 1,4-butanediol, 1,6-hexanediol, 2-butene-1,4-diol, 2,2,4-trimethyl-1,3-pentanediol, 1,4-bis-β-hydroxyethoxycyclohexane, cyclohexanediol, tricyclodecanedimethanol, hydrogenated bisphenol A, hydrogenated bisphenol F, ethyleneoxide adduct of bisphenol A; propyleneoxide adduct of bisphenol A, ethyleneoxide adduct of bisphenol F, propyleneoxide adduct of bisphenol F, ethyleneoxide adduct of hydrogenated bisphenol A, propyleneoxide adduct of hydrogenated bisphenol A, hydroquinone dihydroxyethyl ether, p-xylylene glycol, dihydroxyethylsulfone, bis(2-hydroxyethyl)-2,4-tolylene-dicarbamate, 2,4-tolylene-bis(2-hydroxyethylcarbamide), 2,4-tolylene-bis(2-hydroxyethylcarbamide), bis(2-hydroxyethyl)-m-xylylenecarbamate and bis(2-hydroxyethyl)isophthalate.

The diisocyanate compounds having the formula (VIII) suitably usable in the present invention include 2,4-tolylene diisocyanate, 2,6-tolylene diisocyanate, p-xylylene diisocyanate, m-xylylene diisocyanate, 4,4'-diphenyl methane diisocyanate, 1,5-naphthylene diisocyanate, 3,3'-dimethyl biphenyl-4,4'-diisocyanate, hexamethylene diisocyanate, trimethylhexamethylene diisocyanate, isophorone diisocyanate, 4,4'-methylene bis(cyclohexyl isocyanate), methylcyclohexane-2,4- or -2,6-diisocyanate and 1,3-bis(isocyanate methyl)cyclohexane.

The azo group-containing polyurethane (C) may contain two or more of the unit (C1) or the unit (C2). In such a case, the azo group-containing polyurethane (C) can be synthesized using two or more of the azo group-containing diols (VI), the diol compounds (VII) or the diisocyanate compounds (VIII).

The azo group-containing polyurethane (C) may contain a unit other than the units (C1) and (C2). In such a case, the azo group-containing polyurethane (C) may be synthesized using diols other than the diols (VI) and (VII), or diamine compounds, together with the compounds (VI), (VII) and (VIII) above.

The other diols than the diols (VI) and (VII) include 3,5-dihydroxy benzoic acid, 2,2-bis(hydroxymethyl) propionic acid, 2,2-bis(3-hydroxyethyl)propionic acid, 2,2-bis(3-hydroxypropyl)propionic acid, bis(hydroxymethyl) acetic acid, bis(4-hydroxyphenyl)acetic acid, 4,4-bis(4-hydroxyphenyl)pentanoic acid, carboxyl group-containing diols such as tartaric acid, polyether diols such as polyethylene glycol and polypropylene glycol, and polyester diols such as polycaprolactone diols, polyvalerolactone diols, polycondensates of dicarboxylic acids and diol compounds.

The diamine compounds include ethylene diamine, tetramethylene diamine, hexamethylene diamine, isophorone diamine, xylylene diamine, piperazine phenylene diamine, diamino diphenyl ether and diamino diphenyl methane.

The azo group-containing polyurethane (C) for the block (C) may be synthesized by mixing the above-mentioned diisocyanate and diol compounds (and diamine compounds) together with a catalyst whose activity is known and which is selected depending on the reactivity of the reactants to be used, in an aprotic solvent. The molar ratio of the diisocyanates to the diol compounds (if necessary the diamine compounds) is preferably 0.8:1 to 1.2:1. When the polyurethane contains an isocyanate group at its end, it is treated with alcohols or amines, to be changed into the polyurethane having no isocyanate group.

As methods for synthesizing the polyurethane (C), one can employ, for example, a method for reacting the diisocyanate compounds with the diol compounds (if necessary, the diamine compounds) by simultaneously introducing these compounds; a method for synthesizing an isocyanate group-containing polyurethane intermediate (so-called "polyurethane prepolymer"), and then reacting the polyurethane prepolymer with the diol compounds (if necessary, the diamine compounds); and the like. However, the method for synthesizing the polyurethane (C) is not restricted to these methods.

The weight-average molecular weight of the azo group-containing polyurethane (C) is generally 2,000–200,000, preferably 5,000–150,000. The number-average molecular weight of this polyurethane is preferably, 2500–75,000.

The unit (C1) having the formula (III) is contained in the azo group-containing polyurethane (C) in an amount of preferably 0.1–30 wt. %, much preferably 0.5–20 wt. %. The unit (C2) having the formula (IV) is contained in the azo group-containing polyurethane (C) in an amount of preferably 10–99.9 wt. %, much preferably 20–99.5 wt. %.

The azo group-containing polyurethane (C) is radically polymerized with the above polymerizable monomer having the formula (I'), to form the present block copolymer binder. In particular, this block copolymer is prepared by radically polymerizing the monomer (I') which forms the block (A), using, as a polymer initiator, an azo group-containing polyurethane containing the units (C1) and (C2). This mechanism is similar to the radical polymerization discussed above and employed in and in scheme (2).

In this radical polymerization, the unit (C1) having the formula (III):

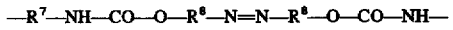

is not maintained in the second block copolymer as it is, because the azo group (—N=N—) is released as nitrogen gas.

More specifically, when radical polymerization occurs, the azo group-containing polyurethane is divided into two radicals as follows:

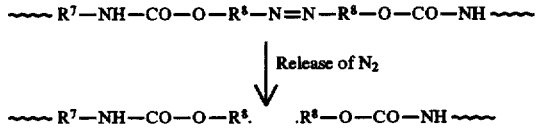

wherein "~~~~" refers to the unit (C2) of the formula (IV).

The two resultant radicals then react with the monomer (I') which forms the block (A), to produce the following block copolymers:

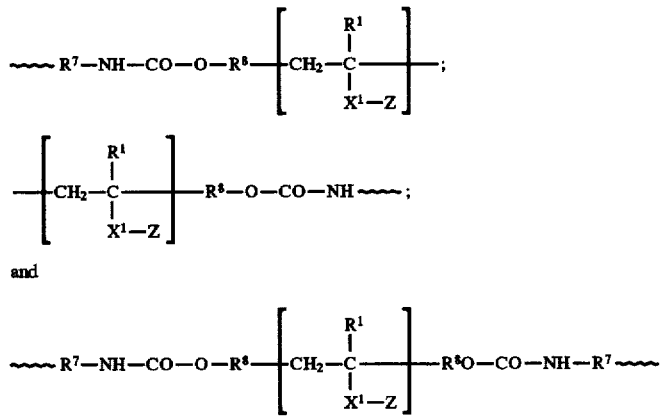

In this case, the polymerizable monomer (I') is used in an amount of preferably 1–200 wt. %, more preferably 5–100 wt. %, based on the weight of the azo group-containing polyurethane.

The azo group-containing polyurethane (C) is reacted with the above monomer (I') together with other radically polymerizable monomers.

Such other radically polymerizable monomers are compounds having a polymerizable unsaturated bond and selected from the group consisting of esters of acrylic acid, acrylamides, esters of methacrylic acid, methacrylamides, allyl compounds, vinyl ethers, vinyl esters, styrenes, esters of crotonic acid and itaconic acid, acrylonitrile or methacrylonitrile, and the like.

Specific examples of esters of acrylic acid include alkyl acrylates wherein the alkyl group is preferably those having $C_1$–$C_{10}$ (e.g., methyl acrylate, ethyl acrylate, propyl acrylate, butyl acrylate, amyl acrylate, 2-ethylhexyl acrylate, octyl acrylate, t-octyl acrylate, chloroethyl acrylate, 2-hydroxyethyl acrylate, 2,2-dimethylhydroxypropyl acrylate, 5-hydroxypentylacrylate, trimethylolpropane monoacrylate, pentaerythritol monoacrylate, glycidyl acrylate, benzyl acrylate, methoxybenzyl acrylate, furfuryl acrylate and tetrahydrofurfuryl acrylate) and aryl acrylates (e.g., phenyl acrylate).

Specific examples of esters of methacrylic acid include alkyl methacrylates wherein the alkyl group is preferably those having $C_1$–$C_{10}$ (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate) and aryl methacrylates (e.g., phenyl methacrylate, cresyl methacrylate, and naphthyl methacrylate).

Specific examples of acrylamides include acrylamide, N-alkyl acrylamides (the alkyl group thereof is those alkyl groups of $C_1$–$C_{10}$, which includes methyl, ethyl, propyl, butyl, t-butyl, heptyl, octyl, cyclohexyl, benzyl and hydroxyethyl); N-aryl acrylamides (the aryl group thereof includes phenyl, tolyl, nitrophenyl, naphthyl, hydroxyphenyl and sulfamoylphenyl); N,N-dialkyl acrylamides (the alkyl group thereof is those alkyl groups of $C_1$–$C_{10}$, which includes methyl, ethyl, butyl, isobutyl, ethylhexyl and cyclohexyl); N,N-diaryl acrylamides (the aryl group thereof includes phenyl); N-methyl-N-phenyl acrylamide; N-hydroxyethyl-N-methyl acrylamide; N-2-acetamidoethyl-N-acetyl acrylamide.

Specific examples of methacrylamides include methacrylamide, N-alkyl methacrylamides (the alkyl group thereof is those alkyl groups of $C_1$-$C_{10}$, which includes methyl, ethyl, t-butyl, ethylhexyl, hydroxyethyl and cyclohexyl); N-aryl methacrylamides (the aryl group thereof includes phenyl, hydroxyphenyl and sulfamoylphenyl); N,N-dialkyl methacrylamides (the alkyl group thereof includes ethyl, propyl and butyl); N,N-diaryl methacrylamides (the aryl group thereof includes phenyl); N-hydroxyethyl-N-methyl methacrylamide; N-methyl-N-phenyl methacrylamide; and N-ethyl-N-phenyl methacrylamide.

Specific examples of the allyl compounds include allyl esters (e.g., allyl acetate, allyl caproate, allyl caprylate, allyl laurate, allyl palmitate, allyl stearate, allyl benzoate, allyl acetoacetate and allyl lactate); and allyloxyethanol.

Specific examples of vinyl ethers include alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether); and vinyl aryl ether (e.g., vinyl phenyl ether, vinyl tolyl ether, vinyl chlorophenyl ether, vinyl 2,4-dichlorophenyl ether, vinyl naphthyl ether and vinyl anthranyl ether).

Specific examples of vinyl esters include vinyl butylate, vinyl isobutylate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl acetate, vinyl benzoate, vinyl salicylate, vinyl chlorobenzoate, vinyl tetrachlorobenzoate and vinyl naphthoate.

Specific examples of styrenes include styrene, alkyl styrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluorostyrene, ethoxymethylstyrene and acetoxymethylstyrene); alkoxystyrenes (e.g., methoxystyrene, 4-methoxy-3-methylstyrene and dimethoxystyrene); and halogenated styrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluorostyrene and 4-fluoro-3-trifluoromethylstyrene).

Specific examples of esters of crotonic acid include alkyl crotonates (e.g., butyl crotonate, hexyl crotonate and glycerins monocrotonate).

Specific examples of esters of itaconic acid include dialkyl itaconates (e.g., dimethyl itaconate, diethyl itaconate and dibutyl itaconate).

Specific examples of dialkyl maleic acid or fumaric acid include dimethyl maleate and dibutyl fumarate.

Among these radically polymerizable monomers, esters of acrylic acid and methacrylic acid, acrylamides, methacrylamides, acrylonitrile and methacrylonitrile. In particular, the above-mentioned monomers which form the unit (V) are preferred. These monomers may be used as a mixture thereof. These monomers are used in an amount of preferably 1–200 wt. %, much preferably 5–100 wt. % based on the weight of the azo group-containing polyurethane.

The block copolymer (2) has a weight-average molecular weight of 2,500 or higher, preferably 5,000–300,000, and has a number-average molecular weight of preferably 2,000–250,000. The polydispersity (weight-average molecular weight/number-average molecular weight) thereof is preferably 1 or higher, more preferably 1.1–10.

The present block copolymers (1) and (2) may be used in photosensitive compositions, singly or as a mixture thereof. These block copolymers are contained in an amount of preferably 2–95 wt. %, more preferably 10–90 wt. %.

Negative-working diazonium compounds usable in the present invention include those diazonium compounds as disclosed in U.S. Pat. Nos. 3,867,147 and 2,632,703. Particularly useful are, for example, diazo resins of condensates between aromatic diazonium salts and active carbonyl-containing compounds (e.g., formadehyde). Preferred diazonium resins include reaction products between anions and condensates, which condensates are produced by condensing diazo monomers with condensating agents at a molar ratio of 1:1 to 1:0.5, preferably 1:0.8 to 1:0.6, according to the conventional process. The diazo monomers include 4-diazo-diphenylamine, 1-diazo-4-N,N-dimethylaminobenzene, 1-diazo-4-N,N-diethylaminobenzene, 1-diazo-4-methyl-N-hydroxyethylaminobenzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-N,N-dimethylaminobenzene, 1-diazo-4-morpholinobenzene, 1-diazo-2,5-dimethoxy-4-p-tolylmercaptobenzene, 1-diazo-2-ethoxy-4-N,N-dimethylaminobenzene, p-diazodimethylaniline, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-morpholinobenzene, 1-diazo 2,5-diethoxy-4-p-tolylmercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-4-diazodiphenylamine, 3-ethoxy-4-diazodiphenylamine, 3-(n-propoxy)-4-diazophenylamine, and 3-isopropoxy-4-diazodiphenylamine. The condensing agents include formaldehyde, acetoaldehyde, propionaldehyde, butylaldehyde, isobutylaldehyde and benzaldehyde. The anions include tetrafluoro boric acid, hexafluoro phosphoric acid, triisopropyl naphthalene sulfonic acid, 5-nitro-o-toluenesulfonic acid, 5-sulfosalicylic acid, 2,5-dimethylbenzene sulfonic acid, 2,4,6-trimethylbenzene sulfonic acid, 2-nitrobenzene sulfonic acid, 3-chlorobenzene sulfonic acid, 3-bromobenzene sulfonic acid, 2-fluorocapryl naphthalene sulfonic acid, dodecyl benzene sulfonic acid, 1-naphthol-5-sulfonic acid, 2-methoxy-4-hydroxy-5-benzoyl-benzene sulfonic acid and paratoluene sulfonic acid. Among them, preferred are hexafluoro phosphoric acid, and alkyl aromatic sulfonic acids such as triisopropyl naphthalene sulfonic acid and 2,5-dimethylbenzene sulfonic acid.

Reaction products between the above-mentioned anions and condensates obtained from the above-mentioned diazo monomers and aldehydes having a carboxylic acid and/or phenol or their acetals (if necessary, the above-mentioned condensating agents); and the diazo resins as disclosed in J. P. Kokai Nos. Hei 1-102456 and 1-102457 are also preferred for the use in the present invention. Especially preferred are diazo resins having a carboxylic acid.

The diazo resins are contained in the present photosensitive composition in an amount of 1–50 wt. %, preferably 3–35 wt. %. If necessary, the diazo resins may be used as a mixture thereof.

The present photosensitive composition may comprise known alkaline soluble polymers other than the above-mentioned block copolymers, such as phenol-formaldehyde resins, cresol-formaldehyde resins, phenol modified xylylene resins, polyhydroxy styrenes, polyhalogenated hydroxystyrenes and carboxyl group-containing epoxy resins, polyacetal resins, acryl resins, methacryl resins, carboxyl group-containing polyurethane resins. These alkaline soluble resins are contained in the photosensitive composition in an amount of 80 wt. % or lower.

The present photosensitive composition may contain additives such as an agent or composition for obtaining a visible image immediately after imagewise exposure; dyes or pigments for dyeing image areas; stabilizers; surfactants; plasticizers; fillers; and the like.

The agent or composition for obtaining a visible image immediately after imagewise exposure includes a combination of organic dyes for forming a salt with a photosensitive compound which releases an acid when exposed. Specific examples thereof include a combination of o-naphthoquinonediazido-4-sulfonic acid halogenide with a salt-forming organic dyes disclosed in J. P. Kokai No. Sho 50-36209 and 53-8128; and a combination of trihalomethyl compound with a salt-forming organic dye as disclosed in J. P. Kokai Nos. Sho 53-36223 and 54-74728. The dyes or pigments for image include dyes or pigments other than the above saltforming organic dyes. Suitable dyes including the salt-forming organic dyes include oil-soluble dyes and basic dyes. Specific dyes include Oil Yellow #101 and #130, Oil Pink #312, Oil Green BC, Oil Blue BOS, Oil Blue #603, Oil Black BY, Oil Black BS, Oil Black T-505 (these dyes are commercially available from Orient Chemical Industries Co., Ltd.), Victoria Pure Blue, Crystal Violet (CI 42555), Methyl Violet (CI42535), Rhodamine B (CIM5170B), Malachite Green (CI42000) and Methylene Blue (CI52015).

Stabilizers for the diazonium compounds include phosphoric acid, phosphorous acid, pyrophosphoric acid, oxalic acid, boric acid, p-toluenesulfonic acid, benzene sulfonic acid, p-hydroxybenzene sulfonic acid, 2-methoxy-4-hydroxy-5-benzoylbenzene sulfonic acid, malic acid, tartaric acid, dipicolinic acid, polyacrylic acid or its copolymer, polyvinylphosphonic acid or its copolymer, polyvinylsulfonic acid or its copolymer, 5-nitronaphthalene-1-phosphonic acid, 4-chlorophenoxymethyl phosphonic acid, sodium phenylmethylpyrazolone sulfonate, 2-phosphonobutane 1,2,4-tricarboxylic acid, 2-phosphonoethane 1,2,2-tricarboxylic acid and 1-hydroxyethane-1,1-disulfonic acid.

Specific agents for improving coating ability include alkyl ethers such as ethylcellulose and methylcellulose.

Specific surfactants include fluorinated surfactants.

Specific plasticizers for imparting coat flexibility and abrasion resistance include tricresyl diphosphate, dimethyl phthalate, dibutylphthalate, trioctyl phosphate, tributyl phosphate, tributyl citrate, polyethylene glycol and polypropylene glycol.

The additional amounts of these additives vary depending on the purposes of their uses. In general, the amounts thereof are 0.5–30 wt. % based on the total solid contents of the photosensitive layer.

The present composition is dissolved in a solvent which dissolves the components of the photosensitive composition and then coated on a substrate. Examples of the solvent include methanol, ethanol, isopropyl alcohol, n-butyl alcohol, t-butyl alcohol, ethylene dichloride, cyclohexane, acetone, methyl ethyl ketone, ethylene glycol, ethylene glycol monomethyl ether, ethylene glycol monoethyl ether, 2-methoxyethyl acetate, 1-methoxy-2-propanol, 1-methoxy-2-propyl acetate, N,N-dimethylformamide, tetrahydrofuran, dioxane, dimethylsulfoxide, ethylacetate, methyl lactate and ethyl lactate. These solvents may be used singly or as a mixture thereof. These solvents may contain a small amount of water or other solvents such as toluene which do not dissolve the diazo resins and the present block copolymers.

The concentration of the photosensitive coating solution suitably ranges from 1–50% expressed in terms of the solid content thereof.

When the coating solution is coated on the substrate, the solution is preferably dried at 50°–120° C. A drying method comprises preheating the coated solution at a lower temperature, and then heating the coated solution at a higher temperature. However, the drying can be conducted by directly heating the coated solution at a high temperature if the solvent and concentration are suitably selected.

The coating amount of the photosensitive composition to be applied onto the surface of the substrate preferably ranges from about 0.5–3.0 g/m$^2$ (weighed after drying). The less the coating amount is, the higher the sensitivity is, but the lower the physical property of the photosensitive layer is.

The foregoing substrate may be a plate-like material having good dimensional stability. Examples of such dimensionally stable plate-like material are paper, paper laminated with a plastic film such as a polyethylene, polypropylene or polystyrene film, metal plates such as aluminum (inclusive of aluminum alloy) plate, zinc plate and copper plate, plastic films such as cellulose diacetate, cellulose triacetate, cellulose propionate, cellulose butyrate, cellulose acetate butyrate, polyethylene terephthalate, polyethylene, polystyrene, polypropylene, polycarbonate and polyvinyl acetal films and paper or plastic films which are laminated with a foil of the foregoing metal or those having a deposited layer of the foregoing metal. Among these substrates, particularly preferred are aluminum plates because of the dimensional stability and low price.

Preferred substrates further include, for instance, composite sheets such as those comprising a polyethylene terephthalate film and an aluminum sheet bonded thereto as disclosed in Japanese Patent Publication for Opposition Purposes (hereinafter referred to as "J. P. Kokoku") No. Sho 48-18327.

The substrates having a metal surface, in particular, aluminum surface are preferably subjected to suitable hydrophilization treatments. As hydrophilization treatments, the aluminum surface may be subjected to wire brushing; brush graining wherein the aluminum surface is grained with nylon brush while pouring a slurry containing abrasive particles; mechanical processes such as ball graining; chemical etching using an etchant such as HF, AlCl$_3$ or HCl; electrolytic graining using nitric acid or hydrochloric acid; and complex graining combining these processes. Then, if necessary, the aluminum surface is etched with acids or alkalis and preferably is anodized with a direct current or alternating current electric power, in an electrolyte selected from the group consisting of sulfuric acid, phosphoric acid, oxalic acid, boric acid, chromic acid, sulfamic acid or mixture thereof, to form a strong passive state layer on the aluminum surface. By this passive state layer, the aluminum surface is hydrophilized. It is much preferable that the anodized aluminum surface is further subjected to silicate treatment using sodium silicate or potassium silicate as disclosed in U.S. Pat. Nos. 2,714,066 and 3,181,461; potassium fluorozirconate treatment as disclosed in U.S. Pat. No. 2,946,638; phosphomolybdate treatment as disclosed in U.S. Pat. No. 3,201,247; alkyl titanate treatment as disclosed in British Patent No. 1,108,559; polyacrylic acid treatment as disclosed in German Patent No. 1,091,433; polyvinyl phosphonic acid treatment as disclosed in German Patent No. 1,134,093 and British Patent No. 1,230,447; phosphonic acid treatment as disclosed in J. P. Kokoku No. Sho 44-6409; phytic acid treatment as disclosed in U.S. Pat. No. 3,307,951; composite treatment using hydrophilic organic polymer and a bivalent metal as disclosed in J. P. Kokai Nos. Sho 58-16893 and 58-18291; and hydrophilization treatment by providing an underlying coating of a water-soluble polymer having a sulfonic acid as disclosed in J. P. Kokai No. Sho 59-101651. The other hydrophilization treatment includes silicate-electrodeposition as disclosed in U.S. Pat. No. 3,658,662.

The photosensitive composition of the present invention provided on the substrate is exposed through image patterns or a transparent original image having dot image or the like and then developed with an aqueous alkaline developer, to form a negative relief to the original image.

Light sources usable for the exposure include carbon arc lamp, mercury lamp, xenon lamp, metal halide lamp, strobe, UV and laser beam.

Preferred examples of the aqueous alkaline developer usable for developing the present photosensitive composition include developing liquid compositions comprising benzyl alcohol, an anionic surfactant, an alkali agent and water as disclosed in J. P. Kokai No. 51-77401; developing liquid compositions comprising benzyl alcohol, an anionic surfactant, and an aqueous solution containing a water-soluble sulfite as disclosed in J. P. Kokai No. 53-44202; and developing liquid compositions comprising an organic solvent, an alkali agent and water, the solvent having a solubility to water of 10 wt. % or lower at a normal temperature.

These developing liquid compositions contain organic solvents. However, these organic solvents are generally toxic, smell bad, and are in danger of fire. Further, those compositions have drawbacks in that they must meet the BOD restrictions for waste liquids, which leads to high cost. Therefore, it is desirable to employ developing liquid compositions containing substantially no organic solvents.

In the specification of the present application, the term "containing substantially no organic solvents" means the content of the organic solvents in-the developing liquid composition is 3 wt. % or lower, preferably 0.5 wt. % or lower, much preferably As developing liquid compositions containing substantially no organic solvents, there have been known those compositions used for developing positive-working photosensitive lithographic printing plates.

However, these compositions are extremely alkaline, and therefore they are in danger of causing rash or inflammation when they contact human body. Therefore, it is preferable that the developing liquid compositions usable for the present invention should not contain substantially no organic solvents and their pH should be 12 or lower.

Alkali agents usable in such developing liquid compositions are preferably weak bases or salts between weak acids and strong bases. Specific Examples of such alkali agents include organic amines such as monoethanol amine, diethanol amine and triethanol amine; and sodium carbonate, potassium carbonate, sodium hydrogen carbonate, potassium hydrogen carbonate, Na or K salts of organic carboxylic acids, Na or K salts (primary, secondary and tertiary) of phosphoric acid, and Na or K salts (primary, secondary and tertiary) of boric acid. Among these alkali agents, organic amines and carbonates are preferred. In order to prevent the deterioration of the developing compositions, it is preferable that two or more alkali agents be used. These alkali agents are used in an amount of 10 wt. % or lower based on the developing liquid composition.

The developing liquid compositions may contain surfactants such as anionic surfactants as disclosed in J. P. Kokai No. Sho 50-51324; amphoteric surfactants; and nonionic surfactants as disclosed in J. P. Kokai Nos. Sho 59-75255 and 60-111246. These surfactant's are used in an amount of 10 wt. % or lower, preferably 6 wt. % or lower based on the developing liquid composition.

The developing liquid compositions usable in the present invention may also contain water-soluble sulfites such as sodium sulfite. Such sulfites are contained in an amount of 5 wt. %, or lower based on the developing liquid composition.

The pH of the developing liquid compositions is preferably 8–11.5.

It is preferable that the photosensitive compositions of the present invention be dissolved or dispersed in the developing liquid compositions as mentioned above. However, it is sufficient that the photosensitive compositions of the present invention are swelled by the developing liquid compositions. In such a case, it is preferable that the unexposed areas of the photosensitive compositions of the present invention are mechanically removed by rubbing them with a brush while they are immersed in the developing liquid compositions.

According to the present invention, the photosensitive composition comprising a diazonium compound and a block copolymer binder having special units provide improved printing durability due to improved abrasion resistance and/or improved chemical-resistance.

EXAMPLES

The present invention will be described in more detail with reference to the following non-limitative working Examples and the effects practically attained by the present invention will also be discussed in detail in comparison with Comparative Examples.

Sunthesis Example 1 of Block Copolymer BP-1

After bubbling a nitrogen stream into a mixed solution of 50 g of ethylacrylate and 100 g of tetrahydrofuran to sufficiently degass the dissolved oxygen, and cooled at −20° C. Into the mixed solution, 0.4 g of 1,1-diphenylbutyl lithium was added thereto and reacted with each other for 12 hrs. To the resultant reaction solution, there was added a mixed solution of 191 g of triphenyl methyl methacrylate and 200 g of tetrahydrofuran, into which a nitrogen stream had been bubbled to sufficiently degass the dissolved oxygen, to cause reaction therebetween for 15 hrs. The resultant mixture was cooled at 0° C., to which mixture 15 ml of methanol was added to continue the reaction for 30 min. and then the reaction was terminated. The resultant reaction mixture was heated at 30° C., to which 100 ml of a 30% hydrochloric acid/ethanol solution was added and stirred for 1 hr.

The reaction mixture was introduced into 2 liters of petroleum ether under stirring and the precipitate was collected by filtration, which precipitate was dried, sufficiently washed with water, and then dried under vacuum.

A mixture of 80 g of the resultant solid, 300 g of N,N-dimethylformamide, 30 g of 2-bromoethanol and 26 g of triethylamine was heated at 80° C. for 3 hrs., while stirring. The mixture was cooled at room temperature, to which 50 g of acetic acid was added. Then, the mixture was introduced into 4 liters of water under stirring. The precipitate was collected by filtration and dried under vacuum, to The resultant reaction mixture was introduced into 1 liter of hexane under stirring. The precipitate was collected by filtration and dried, to obtain Block Copolymer BP-2 having the following formula (46 g). The weight-average molecular weight thereof is $4.3 \times 10^4$ (Gel permeation chromatography: polystyrene standard).

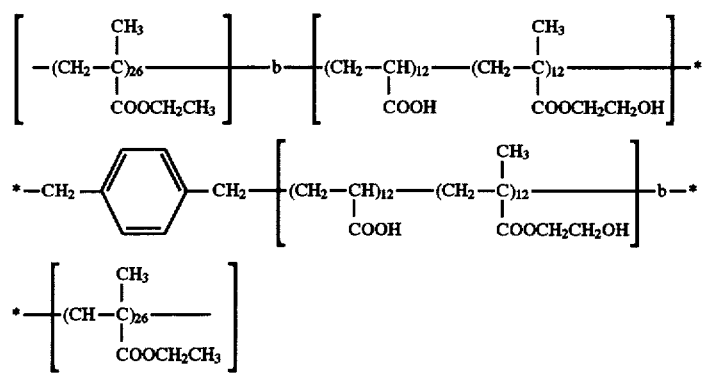

obtain Block Copolymer BP-1 (75 g). The weight-average molecular weight thereof is $7.3 \times 10^4$ (Gel permeation chromatography: polystyrene standard). The structure of the block copolymer has the following formula:

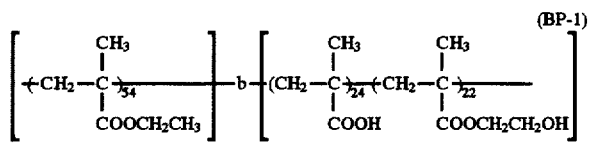
(BP-1)

wherein —b— means a block bond and the indicated number outside the parenthesis means the weight ratio of the composition.

Synthesis Example 2 of Block Copolymer BP-2

A mixed solution containing 25 g of acrylic acid, 25 g of 2-hydroxyethyl methacrylate, 100 g of tetrahydrofuran and 7 g of a photopolymerization initiator having the following formula was heated at 40° C. under a nitrogen stream. This solution was irradiated with light from a high pressure mercury lamp of 400 W at a distance of 10 cm therefrom through a glass filter for 10 hrs., to conduct the polymerization. The resultant reaction mixture was introduced into 1 liter of hexane under stirring. The precipitate was collected by filtration and dried, to obtain the copolymer (42 g). The weight-average molecular weight thereof is $2.0 \times 10^4$ (Gel permeation chromatography: polystyrene standard).
(Photopolymerization initiator)

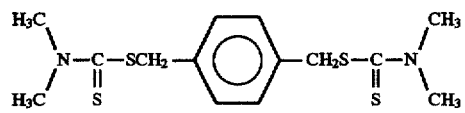

A mixed solution containing 25 g of the copolymer, 25 g of ethyl methacrylate and 100 g of tetrahydrofuran was heated at 50° C. under a nitrogen stream, followed by irradiating light to the mixture to conduct the polymerization for 15 hrs. in the same manner as the above.

Synthesis Example 3 of Block Copolymer BP-3

Into a flask with a stirrer and a cooler, 100 g of 2-methoxyethylacetate was introduced and heated-at 85° C. under a nitrogen stream.

Into this flask, 100 g of benzyl acrylate, 2 g of β-mercaptopropionic acid, 0.8 g of 4,4'-azobis(4-cyanovaleric acid) and 100 g of 2-methoxyethylacetate were dropwise introduced at a constant flow rate over 2.5 hrs. After the completion of the introduction, the content was further stirred at 85° C. for 3 hrs.

The flask was cooled to room temperature and the content therein was introduced into 1 liter of hexane under stirring. After the supernatant liquid was decanted, 500 ml of methanol was added to the remaining product, followed by decantation of the supernatant liquid from the mixture, and the remaining product was dried under vacuum.

The resultant viscous material was dissolved in 150 g of 2-methoxyethyl acetate. To the resultant solution, 2.3 g of 2,2'azobis[2-methyl-N-(2-hydroxyethyl)propionamide] and 0.2 g of 4-(N,N-dimethylamino)pyridine were added. To the resultant mixture, there was dropwise added a solution of 3.5 g of dicyclohexylcarbodiimide in 10 g of methylene chloride over 1 hr. After the addition of the solution, the mixture was stirred for additional 2 hrs. 1 g of formic acid was added to the mixture and further stirred for 30 min.

After the insoluble matter was filtered with Celite, the filtrate was introduced into 1 liter of hexane and then the supernatant liquid was decanted. 500 ml of methanol was added to the remaining material and stirred, and then the supernatant liquid was decanted, followed by drying the remaining material under vacuum. The resultant polymer (62 g) having the following formula (hereinafter referred to as polymeric azobis initiator) has a weight-average molecular weight of $1.4 \times 10^4$ (Gel permeation chromatography: polystyrene standard).

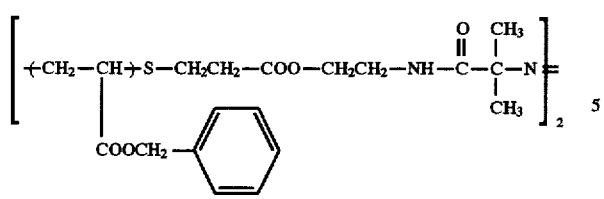

Into a flask with a stirrer and a cooler, 100 g of 1-methoxy-2-propanol was introduced and heated at 95° C. while stirring and under a nitrogen stream.

Into this flask, 40 g of the polymeric azobis initiator, 20 g of methacrylic acid, 20 g of 2-hydroxyethyl methacrylate, 20 g oE p-cyanobenzyl methacrylate and 100 g of 1-methoxy-2-propanol were dropwise introduced at a constant flow rate for 2.5 hrs. After the completion of the introduction, the content was further stirred at 95° C. for 6 hrs.

The reaction mixture was introduced into 3 liters of water under stirring. The precipitate was collected by filtration, followed by drying under vacuum, to obtain Block Copolymer BP-3 (88 g) having the following formula. The weight-average molecular weight thereof is $3.8 \times 10^4$ (Gel permeation chromatography: polystyrene standard).

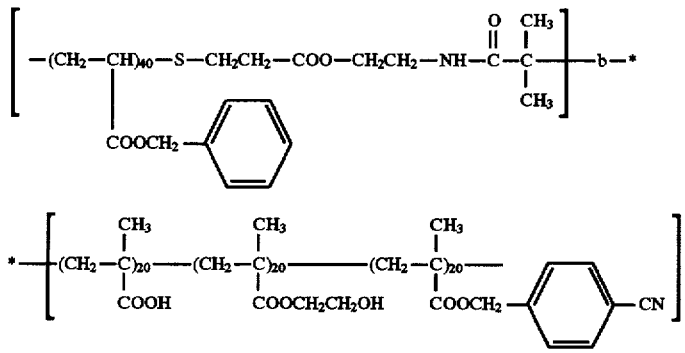

Synthesis Examples 4–8 of Block Copolymers BP-4~8

The following Block Copolymers BP-4~8 were synthesized in the same manner as Synthesis Examples 1~3. The weight-average molecular weights of these copolymers are $2.9 \times 10^4 \sim 1.1 \times 10^5$ (Gel permeation chromatography: polystyrene standard).

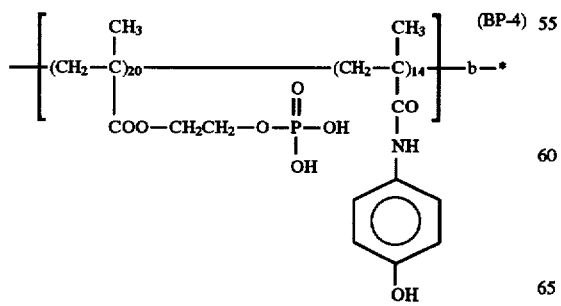
(BP-4)

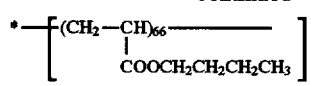
-continued

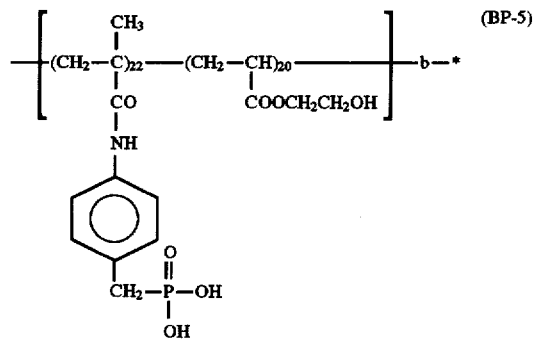
(BP-5)

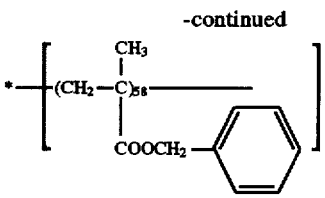
-continued

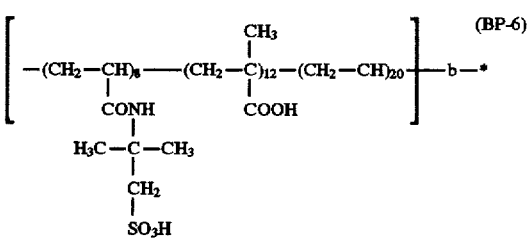
(BP-6)

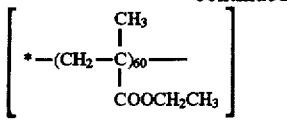

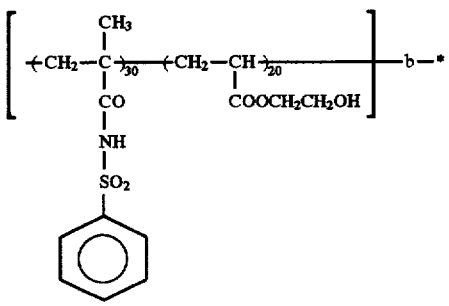

(BP-7)

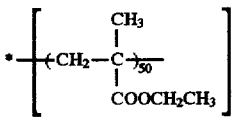

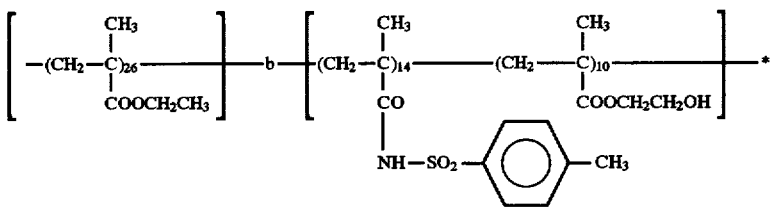

(BP-8)

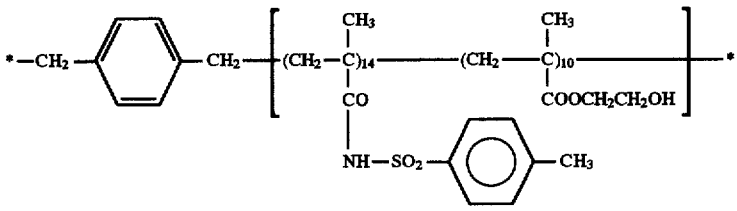

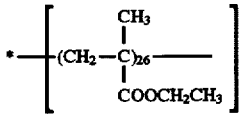

Synthesis Comparative Example 1 of Comparative Random Copolymer RP-1

A mixture containing 50 g of ethyl acrylate, 25 g of methacrylic acid, 25 g of 2-hydroxyethyl acrylate and 200 g of 1-methoxy-2-propanol was heated at 75° C. while stirring under a nitrogen stream. To this mixture, 1 g of dimethyl 2,2'-azobis isobutyrate was added and stirred for 3 hrs. Again, 1 g of dimethyl 2,2'-azobis isobutyrate was added thereto and stirred for 3 hrs. The reaction mixture was introduced into 3 liters of water under stirring. The precipitate was collected by filtration and dried to obtain 95 g of white solid. The weight average molecular-weight thereof is $3.7 \times 10^4$ (Gel permeation chromatography: polystyrene standard). The structure of the solid is as follows:

RP-1

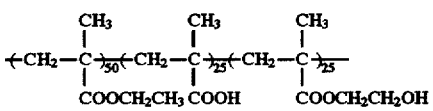

Synthesis Comparative Examples 2~5 of Comparative Random Copolymers RP-2~5

Comparative random block copolymers RP-2~5 having the following formulae were synthesized in the same manner as Synthesis Comparative Example 1. The weight-average molecular weight thereof is $2.2 \times 10^4 \sim 8.2 \times 10^4$ (Gel permeation chromatography: polystyrene standard).

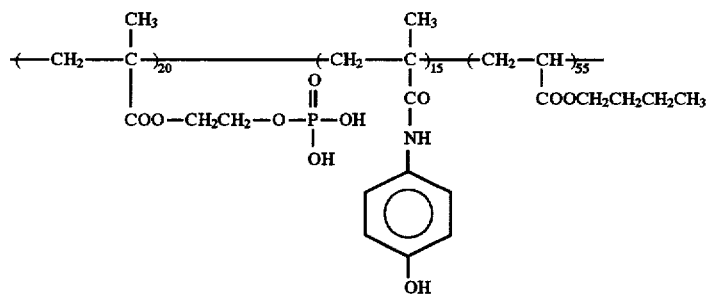
(RP-2)

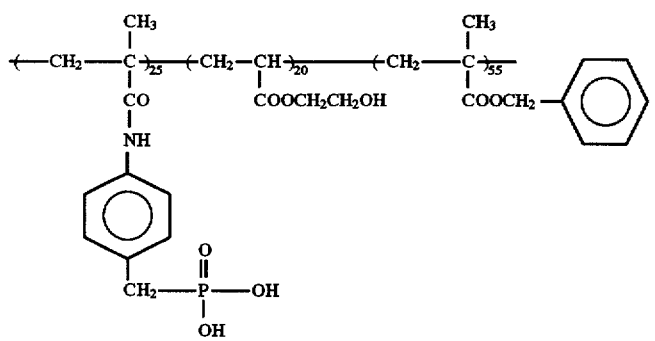
(RP-3)

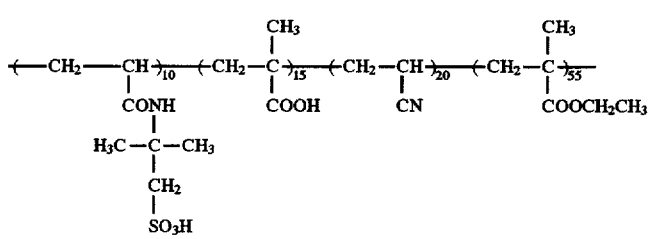
(RP-4)

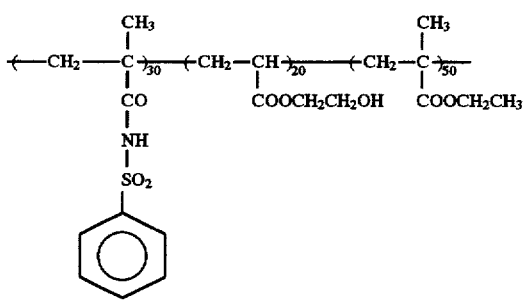
(RP-5)

Example 1

A substrate was prepared according to the method disclosed in J. P. Kokai No. Sho 56-28893. More specifically, the surface of an aluminum plate having a thickness of 0.24 mm was grained with an aqueous suspension of pumice (400 mesh) and a nylon brush and then the plate was sufficiently washed with water. After etching the plate by immersing it in a 10% aqueous solution of sodium hydroxide at 70° C. for 60 seconds, the plate was washed with running water, neutralized and washed with a 20% nitric acid solution and then washed with water. The plate was electrolytically surface-toughened using sinusoidal alternating current under conditions of a voltage of 12.7 V; a ratio of an anode time electricity to cathode time electricity being 0.8; and an anode time electricity of 160 coulomb/dm$^2$, in a 1% aqueous nitric acid solution. The surface roughness was determined at this stage and found to be 0.6μ (in terms of Ra unit). Subsequently, the plate was immersed in a 30% aqueous sulfuric acid solution at 55° C. for 2 minutes to perform desmutting and then anodized at a current density of 2 A/dm$^2$ for 2 minutes in a 20% aqueous sulfuric acid solution so that the thickness of the resulting anodic oxide layer reached 2.7 g/m$^2$. Then, the plate was immersed in a 2.5% aqueous solution of sodium silicate at 70° C. for 1 minute, washed with water and dried.

Photosensitive solutions V-1~V-8 having the following compositions were applied onto the surface of the aluminum plate thus treated with a whirler so that the amount of the photosensitive solutions was 2 g/m$^2$ (weighed after drying), and dried at 100° C. for 2 minutes to give photosensitive lithographic printing plates V-1~V-8.

The block copolymers of the present invention used in the photosensitive solutions V-1~V-8 are listed in Table 1 below.

| Photosensitive Solutions V-1 ~ V-8 | |
|---|---|
| The present block copolymers (see Table 1) | 5.0 g |

-continued

| Photosensitive Solutions V-1 ~ V-8 | |
|---|---|
| 4-n-Dodecylbenzene sulfonate of a condensate of 4-diazodiphenylamine and phenoxyacetic acid with formaldehyde | 0.5 g |
| Oil-soluble dye (Victoria Pure Blue BOH) | 0.1 g |
| Malic acid | 0.05 g |
| Fluorine atom-containing nonionic surfactant (Fluorad FC-430, available from 3M Corporation) | 0.05 g |
| 1-Methoxy-2-propanol | 100 g |

As comparative examples, photosensitive solutions W-1~W-5 were prepared in the same manner except that the comparative random block copolymers were used in place of the present block copolymers. In the same manner as above, photosensitive lithographic printing plates W-1~W-5 were prepared. The comparative random block copolymers are also listed in Table 1.

These photosensitive lithographic printing plates V-1~V-8 and W-1~W-5 were imagewise exposed for 1 minute using PS light available from Fuji Photo Film Co., Ltd. at a distance of 1 m therefrom, immersed in the following developing liquid [S] for 50 seconds, and then lightly rubbed with a brush at their surfaces to remove the unexposed areas. The pH of the developing liquid [S] was 12 or lower.

| Developing Liquid[s]: | |
|---|---|
| NaHCO$_3$ | 10 g |
| Na$_2$CO$_3$ | 20 g |
| Compound of the following formula: | 50 g |

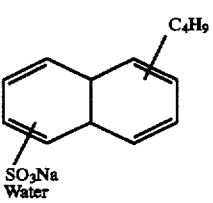

| Water | 920 g |
|---|---|

The resultant lithographic printing plates were attached to GTO type printer available from Heidelberg Company and printing was made on sheets of pure paper with this printer using commercially available oil ink. The number of printed papers obtained were determined for those lithographic printing plates. The results are shown in Table 1 below.

As is apparent from the results in the table, the lithographic printing plates V-I~V-8 provide much more printed papers than the lithographic printing plates W-1~W-5, and therefore the lithographic printing plates using the present block copolymers are superior in printing durability to the comparative random copolymers.

TABLE 1

| Photosensitive lithographic printing plate | Copolymer Used | Number of printed papers |
|---|---|---|
| V-1 | BP-1 | 60,000 |
| V-2 | BP-2 | 62,000 |
| V-3 | BP-3 | 65,000 |
| V-4 | BP-4 | 55,000 |
| V-5 | BP-5 | 55,000 |
| V-6 | BP-6 | 52,000 |
| V-7 | BP-7 | 60,000 |
| V-8 (Control) | BP-8 | 62,000 |
| W-1 | RP-1 | 40,000 |
| W-2 | RP-2 | 35,000 |
| W-3 | RP-3 | 36,000 |
| W-4 | RP-4 | 30,000 |
| W-5 | Rp-5 | 38,000 |

Example 2

These photosensitive lithographic printing plates V-1~V-3 and W-1 were imagewise exposed for 1 minute using PS light available from Fuji Photo Film Co., Ltd. at a distance of 1 m therefrom, immersed in the following developing liquids [T] and [U], respectively for 50 seconds, and then lightly rubbed unexposed areas. The pH of the developing liquids [T] and [U] was 12 or lower.

| Developing Liquid [T]: | |
|---|---|
| NaHCO$_3$ | 15 g |
| Na$_2$CO$_3$ | 25 g |
| Water | 960 g |
| Developing Liquid [U]: | |
| Triethanol amine | 20 g |
| Monoethanol amine | 2 g |
| Water | 978 g |

The resultant lithographic printing plates were attached to GTO type printer available from Heidelberg Company and printing was made on sheets of pure paper with this printer using commercially available oil ink. The number of printed papers obtained were determined for those lithographic printing plates. The results are shown in Table 2 below.

As is apparent from the results in the table, the lithographic printing plates V-1 to V-3 provide much more printed papers than the lithographic printing plate W-1, and therefore the lithographic printing plates using the present block copolymers are superior in printing durability to the comparative random copolymers.

TABLE 2

| Photosensitive lithographic printing plate | Developing liquid used | Number of printed papers |
|---|---|---|
| V-1 | T | 58,000 |
| V-2 | T | 60,000 |
| V-3 | T | 60,000 |
| W-1 (Control) | T | 38,000 |
| V-1 | U | 55,000 |
| V-2 | U | 55,000 |
| V-3 | U | 58,000 |
| W-1 (Control) | U | 35,000 |

Synthesis Example 9 of Azo Group-containing Polyurethane AU-1

Into a flask with a stirrer and a cooler, 17.52 g (0.07 mole) of 4,4'-diphenylmethane diisocyanate, 5.05 g (0.03 mole) of hexamethylene diisocyanate, 8.56 g (0.095 mole) of 1,4-butane diol and 32.57 g of N,N-dimethylacetoamide were introduced and stirred at room temperature. To this mixture, 0.01 g of di-n-butyl tin dilaurate was added and stirred at room temperature for 5 hrs.

To the resultant mixture, 1.44 g (0.005 mole) of 2,2'-azobis[2-methyl-N-(2-hydroxyethyl)propionamide]was added and stirred at room temperature for 24 hrs. To this reaction solution, 50 g of methanol and 50 g of acetone were added and stirred. The resultant mixture was introduced into 2 liters of water under stirring. The precipitate was collected by filtration and dried, to obtain 29.6 g of white solid (polyurethane). The weight-average molecular weight of this polyurethane solid was determined by gel permeation chromatography (polystyrene standard) to be $3.2 \times 10^4$.

Synthesis Example 10 of Azo Group-containing Polyurethane AU-2

Into a flask with a stirrer and a cooler, 12.51 g (0.05 mole) of 4,4'-diphenylmethane diisocyanate, 11.11 g (0.05 mole) of isophorone diisocyanate, 7.66 g (0.085 mole) of 1,4-butane diol, 1.06 g (0.01 mole) of diethylene glycol and 33.78 g of N,N-dimethyl acetoamide were introduced and stirred at room temperature. To this mixture, 0.01 g of di-n-butyl tin dilaurate was added and stirred at room temperature for 5 hrs.

To the resultant mixture, 1.44 g (0,005 mole) of 2,2'-azobis[2-methyl-N-(2-hydroxyethyl)propionamide] was added and stirred at room temperature for 24 hrs. To this reaction solution, 50 g of methanol and 50 g of acetone were added and stirred. The resultant mixture was introduced into 2 liters of water under stirring. The precipitate was collected by filtration and dried, to obtain 30.8 g of white solid (polyurethane). The weight-average molecular weight of this polyurethane solid was determined by gel permeation chromatography (polystyrene standard) to be $3.8 \times 10^4$.

Synthesis Example 11 of Block Copolymer BP-9

Into a flask with a stirrer and a cooler, 15 g of AU-1, 9 g of methacrylic acid, 6 g of 2-hydroxyethylmethacrylate and 60 g of 1-methoxy-2-propanol were introduced and stirred at 90° C. for 10 hrs. under a nitrogen stream. After cooling the reaction solution, it was introduced into 2 liters of water under stirring. The precipitate was collected by filtration and dried, to obtain 28.7 g of white solid (BP9). The weight-average molecular weight of BP-9 was determined by gel permeation chromatography (polystyrene standard) to be $3.5 \times 10^4$.

Synthesis Examples 12–16 of Block Copolymers BP-10–14

In the same manner as Synthesis Example 9, the present block copolymers (BP-10~14) were prepared using the azo group-containing polyurethanes and the radically polymerizable monomers as shown in Table 3 below. The weight-average molecular weight of these block copolymers was determined by gel permeation chromatography (polystyrene standard) to be $2.5 \times 10^4 \sim 1.1 \times 10^5$.

TABLE 3

| Block Copolymer | Azo Group-containing Polyurethane (weight ratio) | Polymerizable Monomer Used (Weight ratio) | |
|---|---|---|---|
| BP-10 | AU-2 (50) | $CH_2{=}CH$ $\|$ $CN$ (20) | $CH_2{=}CH$ $\|$ $COOH$ (30) |
| BP-11 | AU-1 (50) | $CH_2{=}CH$ $\|$ $CONH{-}\text{C}_6\text{H}_4{-}OH$ (20) | $CH_3$ $\|$ $CH_2{=}C$ $\|$ $COOCH_2CH_2{-}O{-}P(=O)(OH){-}OH$ (20) |
| BP-12 | AU-1 (40) | $CH_3$ $\|$ $CH_2{=}C$ $\|$ $COOCH_2{-}\text{C}_6\text{H}_4{-}CN$ (35) | $CH_3$ $\|$ $CH_2{=}C$ $\|$ $CONH{-}\text{C}_6\text{H}_4{-}CH_2{-}P(=O)(OH){-}OH$ (25) |
| BP-13 | AU-1 (60) | $CH_2{=}CH$ $\|$ $COOCH_2CH_2OH$ (20) / $CH_3$ $\|$ $CH_2{=}C$ $\|$ $COOH$ (10) | $CH_2{=}CH$ $\|$ $CONH{-}C(CH_3)_2{-}CH_2{-}SO_3H$ |

TABLE 3-continued

| Block Copolymer | Azo Group-containing Polyurethane (weight ratio) | Polymerizable Monomer Used (Weight ratio) | |
|---|---|---|---|
| BP-14 | AU-1 (50) | $CH_2=C(CH_3)COOCH_2CH_2OH$ (15) | $CH_2=CH\text{-}CONHSO_2\text{-}C_6H_4\text{-}CH_3$ (35) |

Synthesis Comparative Example 6 of Comparative Polymer RP-6

Into a flask with a stirrer and a cooler, 17-52 g (0.07 mole) of 4,4'-diphenylmethane diisocyanate, 5.05 g (0–03 mole) of hexamethylene diisocyanate, 13.41 g (0.1 mole) of 2,2-bis (hydroxymethyl)propionic acid and 35.98 g of N,N-dimethylacetoamide were introduced and stirred at room temperature. To this mixture, 0.01 g of di-n-butyl tin dilaurate was added and stirred at room temperature for 5 hrs.

To this reaction solution, 50 g of methanol and 50 g of acetone were added and stirred. The resultant mixture was introduced into 2 liters of water under stirring. The precipitate was collected by filtration and dried, to obtain 33.1 g of white solid. The weight-average molecular weight of this solid was determined by gel permeation chromatography (polystyrene standard) to be $3.5\times10^4$.

Synthesis Comparative Example 7 of Comparative Polymer RP-7

Into a flask with a stirrer and a cooler, 30 g of 1-methoxy-2-propanol was introduced and heated at 75° C. under a nitrogen stream wider stirring. Into this flask, a mixture containing 15 g of ethyl methacrylate, 9 g of methacrylic acid, 6 g of 2-hydroxyethyl methacrylate, 30 g of 1-methoxy-2-propanol, and 0.78 g of dimethyl 2,2'-azobis isobutyrate were dropwise introduced at a constant rate over 2.5 hrs. Then, the reaction mixture was stirred at 75° C. for another 3 hrs. The mixture was introduced into 2 liters of water. The precipitate was collected by filtration and dried, to obtain 29.1 g of white solid copolymer. The weight-average molecular weight of the copolymer was determined by gel permeation chromatography (polystyrene standard) to be $4.2\times10^4$.

Example 3

An aluminum substrate was prepared in the same manner as Example 1. Photosensitive solutions X-1~X-6 having the following compositions were applied onto the surface of the aluminum substrate thus treated with a whirler so that the amount of the photosensitive solutions was 2 g/m² (weighed after drying), and dried at 100° C. for 2 minutes to give photosensitive lithographic printing plates X-1~X-6.

The block copolymers of the present invention (BP-9~14) used in the photosensitive solutions X-1~X-6 are listed in Table 4 below.

| Photosensitive Solutions X-1 ~ X-6: | |
|---|---|
| The present block copolymers (see Table 4) | 5.0 g |

| Photosensitive Solutions X-1 ~ X-6: | |
|---|---|
| 4-n-Dodecylbenzene sulfonate of a condensate of 4-diazodiphenylamine and phenoxyacetic acid with formaldehyde | 0.5 g |
| Oil-soluble dye (Victoria Pure Blue BOH) | 0.1 g |
| Malic acid | 0.05 g |
| Fluorine atom-containing nonionic surfactant (Fluorad FC-340, available from 3M Corporation) | 0.05 g |
| 1-Methoxy-2-propanol | 100 g |

As comparative examples, photosensitive solutions Y-1~Y-2 were prepared in the same manner except that the comparative polymers (RP-6 and 7) were used in place of the present block copolymers. In the same manner as above, photosensitive lithographic printing plates Y-1~Y-2 were prepared. The comparative polymers are also listed in Table 4.

A gray scale tablet available from Fuji Photo Film Co., Ltd. was placed on these photosensitive lithographic printing plates X-1~X-6 and Y-1~Y-2. Then, they were imagewise exposed for 1 minute using PS light available from Fuji Photo Film Co., Ltd. at a distance of 1 m therefrom, immersed in the above developing liquid [S] for 50 seconds, and then lightly rubbed with a brush at their surfaces to remove the unexposed areas.

The resultant lithographic printing plates were attached to GTO type printer available from Heidelberg Company and printing was made on sheets of pure paper with this printer using commercially available UV ink. The number of printed papers obtained were determined for those lithographic printing plates. The results are shown in Table 4 below.

As is apparent from the results in the table, the lithographic preriting plates X-1~X-6 provide much more printed papers than the lithographic printing plates Y-1~Y-2, and therefore the lithographic printing plates using the present block copolymers are superior in printing durability to the comparative random copolymers, when UV ink is used for printing.

TABLE 4

| Photosensitive lithographic printing plate | Copolymer used | Number of printed papers |
|---|---|---|
| X-1 | BP-9 | 52,000 |
| X-2 | BP-10 | 50,000 |
| X-3 | BP-11 | 52,000 |

TABLE 4-continued

| Photosensitive lithographic printing plate | Copolymer used | Number of printed papers |
|---|---|---|
| X-4 | BP-12 | 50,000 |
| X-5 | BP-13 | 50,000 |
| X-6 (Control) | BP-14 | 48,000 |
| Y-1 | RP-6 | 37,000 |
| Y-2 | RP-7 | 30,000 |

Example 4

These photosensitive lithographic printing plates X-1~X-2 and Y-1 w-Y-2 were imagewise exposed for 1 minute using PS light available from Fuji Photo Film Co., Ltd. at a distance of 1 m therefrom, immersed in the above developing liquids [T] and [U], respectively for 50 seconds, and then lightly rubbed with a brush at their surfaces to remove the unexposed areas.

The resultant lithographic printing plates were attached to GTO type printer available from Heidelberg Company and printing was made on sheet of pure paper with this printer using commercially available UV ink. The number of printed papers obtained were determined for those lithographic printing plates. The results are shown in Table 5 below.

As is apparent from the results in the table, the lithographic printing plates X-1~X-2 provide much more printed papers than the lithographic printing plates Y-1~Y-2, and therefore the lithographic printing plates using the present block copolymers are superior in printing durability to the comparative random copolymers, when UV ink is used for printing.

TABLE 5

| Photosensitive lithographic printing plate | Developing liquid used | Number of printed papers |
|---|---|---|
| X-1 | T | 51,000 |
| X-2 | T | 50,000 |
| Y-1 (Control) | T | 35,000 |
| Y-2 (Control) | T | 30,000 |
| X-1 | U | 50,000 |
| X-2 | U | 48,000 |
| Y-1 (Control) | U | 35,000 |
| Y-2 (Control) | U | 28,000 |

While the present invention has been described in terms of various preferred embodiments, a skilled artisan will appreciate the various modifications, substitutions, omissions and changes that may be made without departing from the spirit thereof. Accordingly, it is intended that the scope of the present invention be limited solely by the scope of the following claims including equivalents thereof.

What is claimed is:

1. A negative-working photosensitive composition comprising a diazonium compound and a polymer binder in admixture, said polymer binder being:

(1) an AB type, ABA type or BAB type block copolymer of:

(i) a block (A) having a unit having the following formula (I):

$$-CH_2-\underset{\underset{X^1-Z}{|}}{\overset{\overset{R^1}{|}}{C}}- \qquad (I)$$

wherein $R^1$ is a hydrogen atom or a methyl group; $X^1$ is a single bond or a bivalent connecting group comprising two or more atoms selected from C, H, N, O and S; Z is —COOH, $$-O-\underset{\underset{OH}{|}}{\overset{\overset{O}{\|}}{P}}-OR^2, \quad -\underset{\underset{OH}{|}}{\overset{\overset{O}{\|}}{P}}-OR^3,$$

—SO$_3$H, or —CONHSO$_2$R$^4$; $R^2$ and $R^3$ are independently a hydrogen atom or a hydrocarbon group of $C_1$–$C_{15}$; and $R^4$ is a hydrocarbon group of $C_1$–$C_{15}$ which optionally has a substituent; and (ii) a block (B) having a unit (II) which having the following formula and being free from unit (I):

$$-CH_2-\underset{\underset{X^2-R^6}{|}}{\overset{\overset{R^5}{|}}{C}}- \qquad (II)$$

wherein $R^5$ is a hydrogen atom or a methyl group; $X^2$ is a single bond, an ester bond, or an amide bond, $R^6$ is a hydrocarbon group having $C_1$–$C_{15}$ which optionally has a substituent, or (2) a block copolymer obtained by subjecting to radical polymerization, (i) an azo group-containing polyurethane (C) which contains a unit (C1) having the following formula (III) and a unit (C2) having the following formula (IV) in the molecule and which has a weight-average molecular weight of 2,000–200,000; and (ii) a polymerizable monomer having the following formula (I'):

$$-R^7-NH-CO-O-R^8-N=N-R^8-O-CO-NH- \qquad (III)$$

wherein $R^7$ is a bivalent hydrocarbon group of $C_2$–$C_{20}$ which optionally has a substituent; and $R^8$ is a bivalent hydrocarbon group of $C_2$–$C_{20}$ which optionally has a substituent and optionally has an amide bond;

$$-R^9-NH-CO-O-R^{10}-O-CO-NH- \qquad (IV)$$

wherein $R^9$ is a bivalent hydrocarbon group of $C_2$–$C_{20}$; and $R^{10}$ is a bivalent hydrocarbon group of $C_2$–$C_{20}$ which optionally has an amide bond, a urea bond, a urethane bond, an ester bond or an ether bond; and $$CH_2=\underset{\underset{X^1-Z}{|}}{\overset{\overset{R^1}{|}}{C}} \qquad (I')$$

wherein $R^1$, $X^1$ and Z are defined above.

2. The photosensitive composition of claim 1, wherein said block (A) is produced from a polymerizable monomer having the following formula (I'):

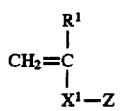 (I')

wherein $R^1$, $X^1$ and Z are defined above.

3. The photosensitive composition of claim 2, wherein said polymerizable monomer having the formula (I') is selected from the group consisting of:

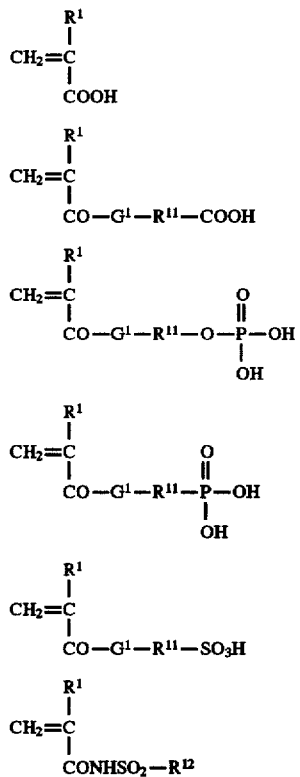

wherein $R^1$ is defined as above; $R^{11}$ is a connecting group of $C_1$–$C_{15}$; $R^{12}$ is a hydrocarbon group of $C_1$–$C_{15}$ which optionally has substituent; and $G^1$ is —O— or —NH—.

4. The photosensitive composition of claim 2, wherein said polymerizable monomer having the formula (I') is selected from the group consisting of:

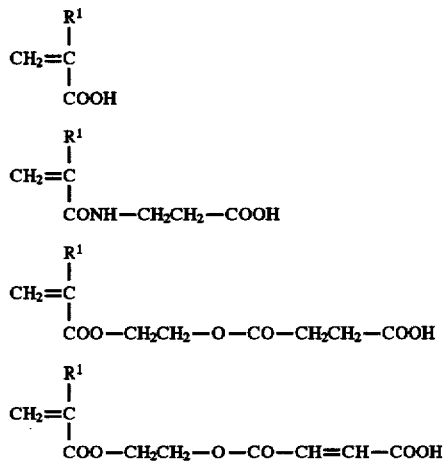

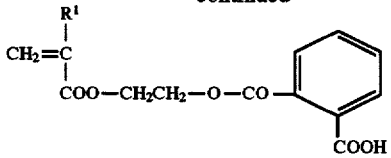

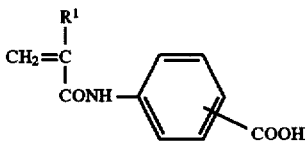

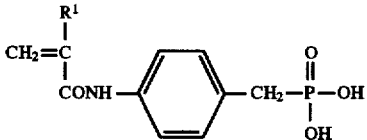

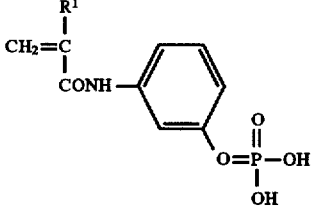

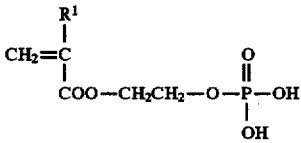

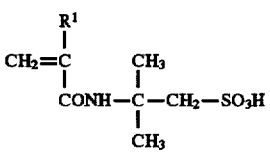

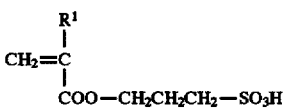

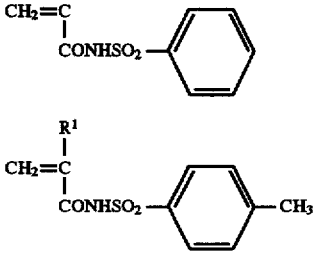

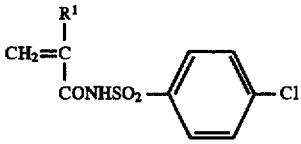

wherein $R^1$ is defined above.

5. The photosensitive composition of claim 1, wherein said block (B) is produced from a polymerizable monomer having the following formula (II):

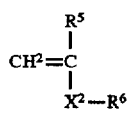

(II')

wherein $R^5$, $X^2$ and $R^6$ are defined above.

6. The photosensitive composition of claim 5, wherein said polymerizable monomer having the formula (II') is selected from the group consisting of esters of acrylic acid, acrylamides, esters of methacrylic acid, methacrylamides, vinyl esters and styrenes.

7. The photosensitive composition of claim 5, wherein said polymerizable monomer having the formula (II') is selected form the group consisting of methyl acrylate, ethyl acrylate, propyl acrylate, butyl acrylate, amyl acrylate, 2-ethylhexyl acrylate, octyl acrylate, octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate and phenyl acrylate; methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate, phenyl methacrylate, cresyl methacrylate, and naphthyl methacrylate; acrylamide, N-methyl acrylamide, N-ethyl acrylamide, N-propyl acrylamide, N-butyl acrylamide, N-heptyl acrylamide, N-octyl acrylamide, N-cyclohexyl acrylamide, N-benzyl acrylamide, N-hydroxyethyl acrylamide, N-phenyl acrylamide, N-tolyl acrylamide, N-naphthyl acrylamide, N-hydroxyphenyl acrylamide, N-sulfamoylphenyl acrylamide, N,N-dimethyl acrylamide, N,N-diethyl acrylamide, N,N-dibutyl acrylamide, N,N-diisobutyl acrylamide, N,N-diethylhexyl acrylamide, N,N-dicyclohexyl acrylamide, N,N-diphenyl acrylamide, N-methyl-N-phenyl acrylamide, N-hydroxyethyl-N-methyl acrylamide, and N-2-acetamidoethyl N-acetyl acrylamide; methacrylamide, N-methyl methacrylamide, N-ethyl methacrylamide, N-t-butyl methacrylamide, N-ethylhexyl methacrylamide, N-hydroxyethyl methacrylamide, N-cyclohexyl methacrylamide, N-phenyl methacrylamide, N-hydroxyphenyl methacrylamide, N-sulfamoylphenyl methacrylamide, N,N-dimethyl methacrylamide, N,N-diethyl methacrylamide, N,N-dibutyl methacrylamide, N,N-diisobutyl methacrylamide, N,N-diethylhexyl methacrylamide, N,N-dicyclohexyl methacrylamide, N,N-diphenyl methacrylamide, N-hydroxyethyl-N-methyl methacrylamide, N-methyl-N-phenyl methacrylamide, and N-ethyl-N-phenyl methacrylamide; vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenyl butyrate, vinyl cyclohexyl carboxylate, vinyl acetate, vinyl benzoate, vinyl salicylate, vinyl chlorobenzoate, vinyl tetrachlorobenzoate, and vinyl naphthoate; styrene, methylstyrene, dimethylstyrene, trimethylstyrene, ethyl styrene, diethyl styrene, isoporpyl styrene, butyl styrene, hexyl styrene, cyclohexyl styrene, decyl styrene, benzyl styrene, chloromethylstyrene, trifluorostyrene, ethoxy methyl styrene and acetoxymethyl styrene; methoxy styrene, 4-methoxy-3-methylstyrene and dimethoxy styrene; chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4trifluorostyrene and 4-fluoro-3-trifluoromethylstyrene.

8. The photosensitive composition of claim 1, wherein said block copolymer of the blocks (A) and (B) contains 5–95 wt. % of the block (A).

9. The photosensitive composition of claim 8, wherein said block copolymer contains 10–90 wt. % of the block (A).

10. The photosensitive composition of claim 1, wherein said azo group-containing polyurethane (C) having the units (C1) and (C2) is produced from the following polymerizable monomers:

(1) azo group-containing diols having the following formula (VI);

(2) diol compounds having the following formula (VII); and (3) diisocyanate compounds having the following formula (VIII);

HO—$R^8$—N=N—$R^8$—OH  (VI)

HO—$R^{10}$—OH  (VII)

OCN—$R^{14}$—NCO  (VIII)

wherein $R^8$ and $R^{10}$ are defined above; and $R^{14}$ is a bivalent hydrocarbon group of $C_2$–$C_{20}$.

11. The photosensitive composition of claim 10, wherein said azo group-containing diols having the formula (VI) are selected from the group consisting of polymerizable monomers having the following formula:

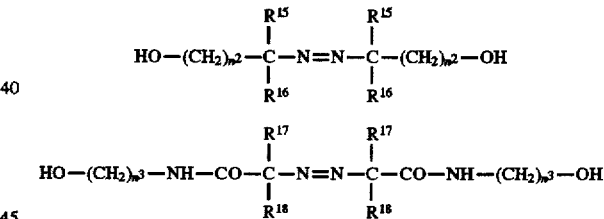

wherein $R^{15}$, $R^{16}$, $R^{17}$ and $R^{18}$ are independently a hydrogen atom, an alkyl group of $C_{10}$ or lower, a cyano group or an aryl of $C_{10}$ or lower; and $n^2$ and $n^3$ are an integer from 0–12.

12. The photosensitive composition of claim 10, wherein said diol compounds having the formula (VII) are selected from the group consisting of ethylene glycol, diethyleneglycol, triethyleneglycol, tetraethyleneglycol, propyleneglycol, dipropyleneglycol, polyethylene glycol, polypropylene glycol, neopentyl glycol, 1,4-butanediol, 1,6-hexanediol, 2-butene-1,4-diol, 2,2,4-trimethyl-1,3-pentanediol, 1,4-bis-β-hydroxyethoxycyclohexane, cyclohexanediol, tricyclodecanedimethanol, hydrogenated bisphenol A, hydrogenated bisphenol F, ethyleneoxide adduct of bisphenol A, propyleneoxide adduct of bisphenol A, ethyleneoxide adduct of bisphenol F, propyleneoxide adduct of bisphenol F, ethyleneoxide adduct of hydrogenated bisphenol A, propyleneoxide adduct of hydrogenated bisphenol A, hydroquinone dihydroxyethyl ether, p-xylylene glycol, dihydroxyethylsulfone, bis(2-hydroxyethyl)-2,4-tolylene-dicarbamate, 2,4-tolylene-bis(2-hydroxyethylcarbamide), 2,4-tolylene-bis(2- hydroxyethylcarbamide), bis(2-hydroxyethyl)-m-xylylenecarbamate and bis(2-hydroxyethyl)isophthalate.

13. The photosensitive composition of claim 10, wherein said diisocyanate compounds having the formula (VIII) are selected from the group consisting of 2,4-tolylene diisocyanate, 2,6-tolylene diisocyanate, p-xylylene diisocyanate, m-xylylene diisocyanate, 4,4'-diphenyl methane diisocyanate, 1,5-naphthylene diisocyanate, 3,3'-dimethyl biphenyl-4,4'diisocyanate, hexamethylene diisocyanate, trimethylhexamethylene diisocyanate, isophorone diisocyanate, 4,4'-methylene bis(cyclohexyl isocyanate), methylcyclohexane-2,4- or -2,6-diisocyanate and 1,3-bis(isocyanatomethyl)cyclohexane.

14. The photosensitive composition of claim 11, wherein said azo group-containing diols having the 4-formula (VI) are selected from the group consisting of polymerizble monomers having the following formulae:

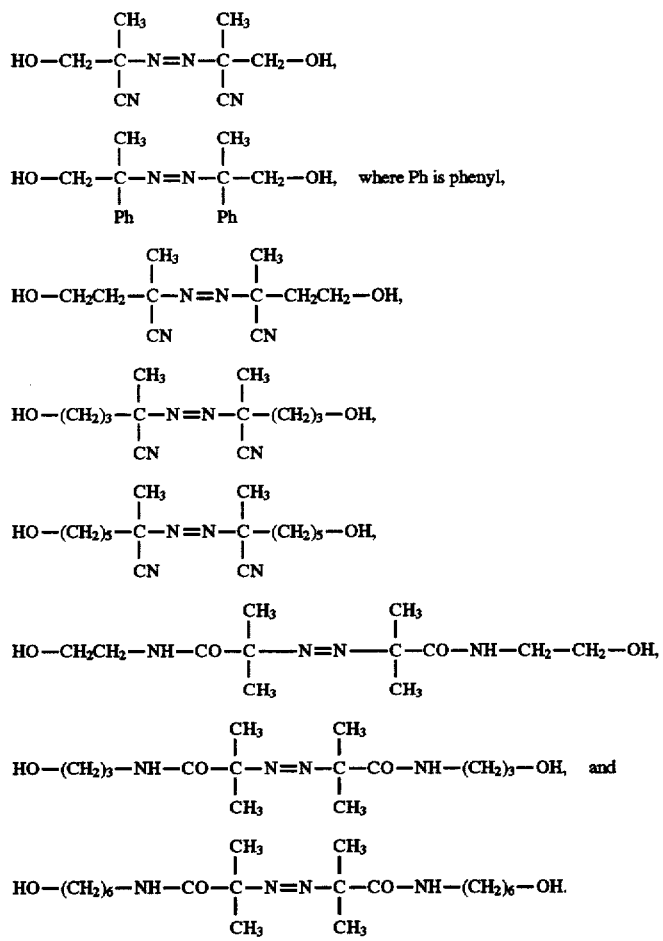

15. The photosensitive composition of claim 10, wherein said azo group-containing polyurethane (C) has a weight-average molecular weight of 5,000–150,000.

16. The photosensitive composition of claim 10, wherein said polymerizable monomer having the formula (I') is used in an amount of 1–200 wt. % based on the azo group-containing polyurethane (C).

17. The photosensitive composition of claim 10, wherein said polymerizable monomer having the formula (I') is used in an amount of 5–100 wt. % based on the azo group-containing polyurethane (C).

* * * * *